(12) United States Patent  
Eyckmans et al.

(10) Patent No.: US 7,791,250 B2  
(45) Date of Patent: Sep. 7, 2010

(54) METHOD FOR ULTRA-FAST CONTROLLING OF A MAGNETIC CELL AND RELATED DEVICES

(75) Inventors: Wouter Eyckmans, Geel (BE); Liesbet Lagae, Herent (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/648,958

(22) Filed: Dec. 29, 2009

(65) Prior Publication Data

US 2010/0164487 A1   Jul. 1, 2010

Related U.S. Application Data

(62) Division of application No. 10/584,699, filed as application No. PCT/EP2004/014815 on Dec. 24, 2004, now Pat. No. 7,638,922.

(60) Provisional application No. 60/533,323, filed on Dec. 29, 2003.

(30) Foreign Application Priority Data

Dec. 24, 2003   (EP)   ................... 03447312

(51) Int. Cl.  
  *H03H 9/25*   (2006.01)  
  *H01L 41/00*   (2006.01)  
(52) U.S. Cl. ..................... 310/313 R; 310/26  
(58) Field of Classification Search ............ 310/313 R, 310/26  
See application file for complete search history.

(56) References Cited

U.S. PATENT DOCUMENTS 4,078,186 A   3/1978   Folen et al.

(Continued)

FOREIGN PATENT DOCUMENTS

GB   1 481 591   8/1977

(Continued)

OTHER PUBLICATIONS

International Search Report for PCT/EP2004/014815 mailed Jun. 1, 2005.

(Continued)

*Primary Examiner*—Thomas M Dougherty  
(74) *Attorney, Agent, or Firm*—McDonnell Boehnen Hulbert & Berghoff LLP

(57) ABSTRACT

The present invention relates to a device and corresponding method for ultrafast controlling of the magnetization of a magnetic element. A device (100) includes a surface acoustic wave generating means (102), a transport layer (104), which is typically functionally and partially structurally comprised in said SAW generating means (102), and at least one ferromagnetic element (106). A surface acoustic wave is generated and propagates in a transport layer (104) which typically consists of a piezo-electric material. Thus, strain is induced in the transport layer (104) and in the ferromagnetic element (106) in contact with this transport layer (104). Due to magneto elastic coupling this generates an effective magnetic field in the ferromagnetic element (106). If the surface acoustic wave has a frequency substantially close to the ferromagnetic resonance (FMR) frequency $v_{FMR}$ the ferromagnetic element (106) is absorbed well and the magnetization state of the element can be controlled with this FMR frequency. The device can be used in an RF-magnetic resonator, a sensor and a camera. The corresponding method can be used for ultrafast reading-out and switching of magnetic components and in magnetic logic.

31 Claims, 14 Drawing Sheets

U.S. PATENT DOCUMENTS

| | | | |
|---|---|---|---|
| 4,586,077 A | 4/1986 | Wonn et al. | |
| 5,057,800 A | 10/1991 | Hanna | |
| 5,260,615 A | 11/1993 | Sahashi et al. | |
| 5,959,388 A | 9/1999 | Graebner et al. | |
| 7,638,922 B2 | 12/2009 | Eyckmans et al. | |

FOREIGN PATENT DOCUMENTS

| | | | |
|---|---|---|---|
| JP | 63-179582 | 7/1988 | |
| JP | 06-069751 | 3/1994 | |
| JP | 08-237058 | 9/1996 | |

OTHER PUBLICATIONS

Maksymowicz L J et al., "Coupling Interaction and Surface Energy in FeBSi1/Si and FeBSi/Pt Multilayered Structures," Thin Solid Films, Elsevier-Sequoia S.A. Lausanne, 191(2):201-210 (1990) XP000149797, ISSN: 0040-6090.

Sander D. et al., "The correlation between mechanical stress and magnetic anisotropy in ultrathin films," Reports on Progress in Physics, 62:809-858 (1999).

Cowburn et al., "Room Temperature Magnetic Quantum Cellular Automata," Science, 287:1466-1468 (2000).

METHOD FOR ULTRA-FAST CONTROLLING OF A MAGNETIC CELL AND RELATED DEVICES

CROSS-REFERENCE TO RELATED APPLICATIONS

This application is a divisional of its parent application, U.S. patent application Ser. No. 10/584,699, entitled "Method for ultra-fast controlling of a magnetic cell and related devices," which issued as U.S. Pat. No. 7,638,922 on Dec. 29, 2009. The parent application was the U.S. national phase of international application PCT/EP04/014815, filed Dec. 24, 2004. The parent application and the international application claim the priority of U.S. Provisional Application 60/533,323, filed Dec. 29, 2003 and of European application 03447312.4, filed Dec. 24, 2003. This application claims the priority of these prior applications. The disclosures of these prior applications are incorporated by reference into this application.

TECHNICAL FIELD OF THE INVENTION

The present invention relates to the field of magnetics. The invention relates to methods, techniques and corresponding devices for controlled manipulation of magnetisation states of ferromagnetic entities as e.g. magnetic layers, cells and components. The invention also relates to RF resonators and magnetic logic and magnetic memories.

BACKGROUND OF THE INVENTION

Currently, magnetisation states in a ferromagnetic component, as e.g. a ferromagnetic MRAM cell, are being manipulated, e.g. switched or changed, and assessed, e.g. read or written, by magnetic fields generated by neighbouring electrical currents, or by applying external magnetic fields.

The technique of magnetic field induced switching by current conductors is widespread and is currently used in a wide series of commercial products. Several types of magnetic field induced switching by current conductors are known. The switching is generally done by a static method, where currents high enough to switch the element are applied and the element switches after waiting long enough. An alternative method for driving magnetisation read-out or for changing the magnetisation state of a ferromagnetic component is making use of ferromagnetic resonance (FMR). Ferromagnetic resonance is an intensively studied phenomenon, which is well known, and its use for the switching and assessment of ferromagnetic components offers several speed and power advantages as compared to regular methods. The mechanism known in the art as 'precessional switching' is based on the ferromagnetic resonance properties of the magnetic device and allows magnetisation reversal with less power and at higher frequencies than with other, older switching schemes.

All the above described techniques, however, have several different problems, such as e.g. current lines are needed for both biasing and magnetic assessment, a bit selection scheme has stringent timing requirements, power consumption is relatively high and different metallisation levels are required. Furthermore, reference cells can be necessary for comparing states during read-out, which reduces the effective cell density. Typically one reference bit per data storage bit is used.

Operating at ferromagnetic resonance frequencies leads to difficulties in controllability and integration. Moreover there is the constant need for external magnetic fields to control the magnetic properties, which limits the use of magnetic materials, even at low frequencies, due to field spreading and power consumption. The latter makes it hard to use FMR in several applications.

It is furthermore a known characteristic of magnetic materials that their magnetic state can be altered by the presence of stress and/or strain in a magnetic material. A typical suitable material for stress state alteration is Ni which is described e.g. in Sander D., "The correlation between mechanical stress and magnetic anisotropy in ultrathin films", Reports on Progress in Physics 62, (1999) p 809. Typically, stress is induced by applying a voltage to a piezo-electric material and the use of stress is only known to be controllable at low frequencies. This limits the use of stress induced switching in e.g. ferromagnetic memory cells.

SUMMARY OF THE INVENTION

It is an object of the present invention to provide novel methods and corresponding devices for ultra fast assessment of magnetic elements with high controllability.

It is a further object of the present invention to provide a read-out scheme for exchange biased spin-valve or tunnel-junction structures, as can be used in e.g. an MRAM-like structure, working at frequencies higher than 1 GHz.

It is furthermore an object of the present invention to provide an in-plane magnetic sensor working at frequencies higher than 1 GHz. Furthermore it is an object of the present invention to provide an in-plane magnetic camera working also at frequencies higher than 1 GHz.

It is another object of the present invention to provide a switching scheme for magnetic layers and components.

It is furthermore an object of the present invention to provide an RF mechanical resonator.

It is another object of the present invention to provide a novel driving mechanism in magnetic logic.

It is furthermore another object of the present invention to provide a method for active compensation of changes in switching behaviour of a magnetic switch.

The above objectives are accomplished by methods and devices according to the present invention.

The present invention provides a method of using magneto-elastic energy conversion to determine or identify or change the magnetisation state of a ferromagnetic element. The use of magneto-elastic energy conversion can be between a magnetic element and a SAW in a piezoelectric layer to interact with the magnetisation state of the magnetic element. The present invention relates to an electronic device comprising a piezoelectric layer and a magnetic element and means for magneto-elastic energy conversion between the magnetic element and a SAW in the piezoelectric layer to interact with the magnetisation state of the magnetic element.

The present invention relates to a device allowing magnetic property interaction comprising at least one surface acoustic wave generating means, a transport layer, and at least one ferromagnetic element, having a ferromagnetic resonance frequency $v_{FMR}$, wherein the surface acoustic wave generating means is adjusted to generate in the transport layer a surface acoustic wave having a wavelength $\lambda_{SAW}$ and having a frequency $v_{SAW}$ substantially equal to said ferromagnetic resonance frequency $v_{FMR}$ or an integer multiple of said ferromagnetic resonance frequency $v_{FMR}$.

The present invention also relates to a device allowing magnetic property interaction, the device comprising a layer comprising piezoelectric material, said layer being adapted for transporting a surface acoustic wave having a frequency $v_{SAW}$, and at least one ferromagnetic element, having a ferromagnetic resonance frequency $v_{FMR}$ and being capable of magneto-elastic energy conversion, wherein said surface acoustic wave frequency $v_{SAW}$ is substantially equal to said ferromagnetic resonance frequency $v_{FMR}$ or an integer multiple of said ferromagnetic resonance frequency $v_{FMR}$ such that said surface acoustic wave interacts with said at least one ferromagnetic element to influence a magnetisation state of said ferromagnetic element. Said at least one ferromagnetic element may be magneto-strictive. The magnetisation state may be used as output of the device. Said integer may be an even integer number, such as e.g. 2. The device may comprise at least one surface acoustic wave generating means for generating said surface acoustic wave having a frequency $v_{SAW}$. The layer comprising piezoelectric material may be a transporting layer. The magneto strictive material is a means for magneto-elastic energy conversion. Said frequency $v_{SAW}$ may be in a range having a width corresponding to a certain fraction of a width of an absorption peak corresponding with said ferromagnetic resonance frequency value $v_{FMR}$ or an integer multiple thereof, and which is centred around the ferromagnetic resonance frequency value $v_{FMR}$ or around an integer multiple thereof, said fraction being 100%, preferably 50%, more preferably 25%, even more preferably 10%, still more preferably 2% or even still more preferably 1%. Said ferromagnetic element may be in contact with said layer comprising piezoelectric material or with said surface acoustic wave generating means. Said contact may be direct contact. Said ferromagnetic element may be not in direct contact with said surface acoustic wave generating means. Said ferromagnetic element may be a part of said surface acoustic wave generating means. The device allowing magnetic property interaction may comprise a means for reading out the magnetic state of the at least one ferromagnetic element. This means for reading out may be a system that can sense the magnetic response to the surface acoustic wave. This means for reading out may be a system for performing a resistance measurement. The magnetization state may be the reading out, also referred to as output, of the system. The reading out may be interpreted. Different effects may be used as an output, like most commonly magnetoresistance, in components as tunnel junctions and spin valves, as well as in single layers as AMR. Furthermore all techniques based on or derived from magnetic imaging techniques may be seen as an output, like, without wanting to be exhaustive, Magnetic Force Microscopy, (Scanning) Hall Probe Microscopy, Magneto Optic Kerr Effect measurements, . . . . Also inductance based techniques can be used with pick-up coils, field sensors (read head, Hall probe), . . . or e.g. measurements of transfer characteristics of pulse lines, since these sense neighbouring magnetic films and their characteristics.

The frequency of the surface acoustic waves may be chosen in a narrow frequency range around the ferromagnetic resonance frequency or multiple thereof.

This range is a material property and depends on the absorption coefficient which for the purpose of this description may be defined as the width of the absorption peak, of the magnetic material. The borders of the peak which define the width, are situated where the absorption is reduced to substantially 0, which may e.g. 0.1, more preferably 0.01, even more preferably 0.001, still more preferably 0.0001. Other parameters which could be used to represent the width of the absorption peak may be the damping parameter a or the Full Width at Half Max value (FWHM). The absorption peak may preferably be as narrow as possible. The frequency range preferably used may then be the range with a width corresponding to a certain fraction of the width of the absorption peak, and which is centred around the maximum absorption frequency value. This fraction may for example be 100%, preferably 50%, more preferably 25%, even more preferably 10%, still more preferably 2% or even still more preferably 1%.

The SAW may alter the properties of the magnetic element, such that the action of an additionally applied magnetic field will be different than without the SAW. The presence of such an additional magnetic field may thus be advantageous for certain embodiments of the present invention.

The device may comprise a means for generating such an additional magnetic field at the ferromagnetic resonance frequency or an integer multiple of said ferromagnetic resonance frequency. The device may be used for 'parametric amplification' where oscillations induced by a weak magnetic field force coming from an additional magnetic field can be amplified by the parametric mechanism. The SAW may act as a parametric pump at double or 2n (an even number of) Times—n being an integer number, advantageously a small integer number as for instance but not limited to 1, 2, 4, 6, 8—the frequency of an oscillating system driven by the weak additional magnetic field force, and, depending on the phase synchronization between the driving force and the parametric pump, an amplification of the oscillation amplitude, indicated by e.g. an absorption peak, or an active compensation or enhancement of the damping, related to the width of the absorption, may be achieved.

The frequency of the surface acoustic wave thus may be such that it is absorbed significantly by the ferromagnetic element. The absorption of the surface acoustic wave may be at least 1%, preferably 25%, more preferably 50%, even more preferably 75% and most preferably at least 99% of the absorption at the ferromagnetic resonance frequency. Furthermore, the surface acoustic wave generating means may comprise part of said layer comprising piezoelectric material. The propagated surface acoustic wave may create an effective magnetic field due to magneto-elastic energy conversion g in said ferromagnetic element so as to manipulate or affect or change a magnetic property of said ferromagnetic element. The magnetic property may be a magnetisation state of said ferromagnetic element. Said magnetic property may be any of switching behaviour, coercivity, biasing, permeability, susceptibility, damping behaviour or absorption behaviour. The length of the ferromagnetic element may be smaller than the wavelength of the surface acoustic wave $\lambda_{SAW}$, preferably smaller than a quarter of the wavelength of the surface acoustic wave $\lambda_{SAW}$. The length may be larger than the wavelength of the surface acoustic wave $\lambda_{SAW}$. The width of the ferromagnetic element may be smaller than the wavelength of the surface acoustic wave $\lambda_{SAW}$, preferably smaller than a quarter of the wavelength of the surface acoustic wave $\lambda_{SAW}$. The width also may be larger than the wavelength of the surface acoustic wave $\lambda_{SAW}$. The ferromagnetic element may be a functional or structural part of a magnetic component. This magnetic component may be any magnetoresistive device, such as for example an AMR, a TMR or a GMR device. The magnetic component may be a spin valve without pinned layers. The magnetic component may be for example a spin valve or a tunnel junction, which may comprise a reference layer with a pinned magnetisation. The surface acoustic wave used in the device may be any of a shear wave and a Rayleigh wave. It also may be any other suitable surface acoustic wave. The ferromagnetic element may be oriented such that the angle between the direction of an easy axis of the ferromagnetic element and the direction of the induced effective magnetic field is different from 0°, preferably is larger than 45°, more preferably is larger than 80°, most preferably is 90°. The surface acoustic wave generating means may be or comprise at least one InterDigitated Transducer. Furthermore, additional surface acoustic wave generating means may be included. E.g. the device may comprise a second acoustic wave generating means. The first surface acoustic wave generating means may be for generating a shear wave in a first surface acoustic wave propagation direction and the second surface acoustic wave generating means may be for generating Rayleigh waves in a second surface acoustic wave propagation direction. The first surface acoustic wave propagation direction and said second surface acoustic wave propagation direction may be orthogonal on each other. The device may also have for at least one surface acoustic wave (SAW) generating means a surface acoustic wave detection means positioned opposed to the SAW generating means relatively to the ferromagnetic element. This surface acoustic wave detection means may be placed diametrically opposed to the SAW generating means relatively to the ferromagnetic element. In this device the SAW generating means may be combined with other means of assessing magnetic elements, i.e. more conventional ways such as magnetic fields generated by current conductors close by, or thermally or spin torque (angular momentum) induced magnetic changes generated by heaters, laser pulses, or currents through the element.

The device may also comprise a plurality of ferromagnetic elements ordered on top of said layer comprising piezoelectric material, so as to provide a magnetic image. The plurality of ferromagnetic elements may be ordered on top of said surface acoustic wave generating means. The device then can act as a magnetic camera. The ferromagnetic elements may be ordered in a number of rows and columns.

The invention also relates to a method for sensing an environmental parameter, said method comprising the steps of allowing at least one ferromagnetic element to interact with an environment of which a environmental quantity has to be measured, generating a surface acoustic wave in a layer comprising piezoelectric material, said surface acoustic wave interacting with said at least one ferromagnetic element, dynamically measuring the variation of a characteristic parameter influenced by said ferromagnetic element, deriving from said variation of a characteristic parameter a corresponding value of a physical quantity of said ferromagnetic element. Said physical quantity of said ferromagnetic element may be a magneto resistance of said ferromagnetic element. Said physical parameter may be a magneto resistance of said ferromagnetic element. In this method, deriving from said variation of a characteristic parameter a corresponding value of said physical quantity may comprise the steps of deriving from the dynamic measurement a degree of anisotropy of said at least one ferromagnetic element and deriving from said degree of anisotropy a corresponding value of said quantity. The method of sensing may be applied in any of the above described devices. In this method the SAW generating means may be combined with other means of assessing magnetic elements, i.e. more conventional ways such as magnetic fields generated by current conductors close by, or thermally or spin torque (angular momentum) induced magnetic changes generated by heaters, laser pulses, or currents through the element. Furthermore, said quantity may be an electromagnetic field, a temperature, a pressure, a density or a stress or other physical property. The variation in magneto-resistance of said at least one ferromagnetic element may be induced by the magnetisation or magnetisation direction of said ferromagnetic element.

The invention may also relate to a method for creating a magnetic image, comprising the steps of allowing a plurality of ordered ferromagnetic elements to interact with an environment of which an image is to be created, generating a surface acoustic wave in a layer comprising piezoelectric material, said surface acoustic wave thus interacting with said plurality of ordered ferromagnetic elements, dynamically measuring, at least a number of, preferably for each of, said plurality of ferromagnetic elements the variation of characteristic parameters influenced by said ferromagnetic elements and deriving from said variation of said characteristic parameters a corresponding value of a physical quantity for said number of said plurality of ferromagnetic elements. The physical quantity of said number of said plurality of ferromagnetic elements may be a magneto resistance of said ferromagnetic elements. In the method, said allowing the plurality of ordered ferromagnetic elements to interact with an environment and said generating a surface acoustic wave may be performed one time for all ferromagnetic elements in parallel and said dynamically measuring the variation and said deriving a corresponding value may be performed on a ferromagnetic element basis. The method may be applied to the camera as described above.

The invention also relates to a method for reading out a readout-value from a device as, for example, described above, comprising the steps of generating a surface acoustic wave, such that a precessional movement of the magnetisation in said at least one ferromagnetic element is achieved and such that a corresponding magnetisation state of said at least one ferromagnetic element is not switched, dynamically measuring the variation of a characteristic parameter influenced by said element and deriving from said variation of said characteristic parameter said read-out value. The characteristic parameter influenced by said ferromagnetic element may be a magneto resistance of said ferromagnetic element. In the method, said deriving from said variation of said characteristic parameter said read-out value may be deriving a phase difference between the input signal applied to said surface acoustic wave generating means and the output signal obtained from said dynamic measurement of said characteristic parameter and deriving from said phase difference a read-out value. Said corresponding magnetisation state is the state corresponding with the magnetisation in said at least one ferromagnetic element. The method may be applied to any of the devices as described above. In the method, the read-out value can correspond to only a number of distinct specific values. The number of distinct values may be two and the values can be represented as '1' and '0'.

The invention also may relate to a method for switching at least one ferromagnetic element, comprising the step of generating a surface acoustic wave, for achieving a precessional movement of the magnetisation in said ferromagnetic element and orienting a corresponding magnetisation state of said ferromagnetic element. The corresponding magnetisation state is the state corresponding with the magnetisation in said ferromagnetic element.

The orienting of the magnetisation state of the ferromagnetic element may be performed by generating a ferromagnetic element specific additional field. This additional field may be quasistatic, pulsed or at frequencies equal to the ferromagnetic resonance $v_{FMR}$ or an integer multiple of this frequency $v_{FMR}$. The additional field may be provided by any means that changes the effective magnetic field felt by the magnetic element. The SAW field and the additional field may also be tuned (e.g. timed) such that only for a certain time or phase synchronization the switching can be initiated. When an array of magnetic components needs to be addressed, the synchronization as well as the amplitude of both the SAW generating means and the additional field may be used to provide selection of a single magnetic element out of the array for reading or writing.

The surface acoustic wave may be a Rayleigh wave and the angle between an easy axis of the ferromagnetic element and the direction of the effective field may be different from 0° and may preferably be more then 45°, more preferably more then 80° and most preferably may be 90° during the first half period of the Rayleigh wave.

The surface acoustic wave also may be a shear wave and the angle between the direction of an easy axis of said ferromagnetic element and the direction of the effective magnetic field generated by said device may preferably be larger than 45°, more preferably larger than 80° and most preferably may be 90°.

The invention also may relate to a method for combined reading and writing of at least one ferromagnetic element. The device then has two surface acoustic wave generating means, whereby the first surface acoustic wave generating means is used for switching according to any of the methods for switching as described above and the second surface acoustic wave generating means may be used for sensing or reading according to any of the methods for reading or sensing as described above. An additional magnetic field at the ferromagnetic resonance frequency or an integer multiple of said ferromagnetic resonance frequency may be applied. The surface acoustic wave may have a frequency that is substantially equal to the ferromagnetic resonance frequency or an integer multiple thereof. The integer multiple may be an even integer multiple, such as e.g. 2.

The invention also may relate to a magnetic resonator comprising a device as described above and furthermore being equipped with a tip that is made of magnetic material and that is supported by a cantilever-type structure and furthermore being positioned near the ferromagnetic element of said device. The tip then senses the GHz frequency oscillation of the magnetic effective field and a corresponding signal can be outputted.

The invention may also relate to an oscillator, a resonator or a filter as is used in telecommunications that is made out of a ferromagnetic material or ferromagnetic multi layer stack on top of a piezoelectric layer, where the ferromagnetic resonance properties (absorption frequency or width of the absorption peak) are altered by the SAW, according to the devices as described above.

The invention also relates to the use of a device as described above for use in magnetic logic. The application of a surface acoustic wave may be the driver of a magnetic logic since it can decrease the threshold energy for magnetic data transport.

The invention also may relate to a method for active tuning of a working frequency of a surface acoustic wave, said method comprising the steps of monitoring the absorption of a surface acoustic wave, generated by a surface acoustic wave generating means, by the ferromagnetic element, deriving from said absorption characteristics the difference between the working frequency of the surface acoustic wave and the ferromagnetic resonance frequency of said ferromagnetic element, and tuning the working frequency of the surface acoustic wave generating means towards the ferromagnetic resonance frequency. The method may be performed in a system comprising a surface acoustic wave detection means and may be performed in a system comprising any of the devices as described above. Furthermore, said tuning of the working frequency of the surface acoustic wave generating means towards the ferromagnetic resonance frequency may be tuning the working frequency to a frequency slightly different from the ferromagnetic resonance frequency. Furthermore, the frequency may correspond with an absorption of said surface acoustic wave by said ferromagnetic element within 1% and 99%, preferably 50% and 90%, more preferably 70% and 90% of the absorption of said surface acoustic wave by said ferromagnetic element at the ferromagnetic resonance frequency.

The invention also relate to an oscillator, which may e.g. be, a resonator or a filter as is used in telecommunications, the oscillator being made of ferromagnetic material or being made of a ferromagnetic multilayer stack on top of a piezoelectric layer, wherein a surface acoustic wave is generated to influence said ferromagnetic material, said influencing comprising changing a ferromagnetic resonance properties.

In the present invention, the ferromagnetic resonance frequency may be larger than 0.5 GHz, preferably larger than 1 GHz. The angles discussed for the different embodiments of the present invention are absolute angles. Furthermore, where a dynamical measurement of the magneto-resistance is discussed, this means that there is a continuous measurement during time, or a measurement at regular times, of the magneto-resistance. Although in the present application the surface acoustic means are discussed, a pulsed laser also could be used as the thermal expansion of the material than could be used for induction of stress or strain in the transport layer leading to generation of a SAW causing effective magnetic fields due to magneto-striction. Although in the embodiment of the present invention, one and two dimensional sensors, cameras and devices are described, the invention also can be used to make a volumetric sensor, e.g. by placing different devices, having a two dimensional structure, on top of each other. These devices may use a common surface acoustic wave generating means.

Particular and preferred aspects of the invention are set out in the accompanying independent and dependent claims. Features from the dependent claims may be combined with features of the independent claims and with features of other dependent claims as appropriate and not merely as explicitly set out in the claims.

It is an advantage of embodiments of the present invention that no external magnetisation input such as an externally induced magnetic field or an incident magnetic wave is needed for operating the device.

It is an advantage of embodiments of the present invention that the systems allows to influence the magnetisation of the magnetic elements. Features described in specific embodiments are not limited to these specific embodiments and may be mutatis mutandis be applied, used or introduced in other embodiments of the present invention. Similarly, features of dependent claims depending on a specific independent claim may be combined with other independent claims. Although there has been constant improvement, change and evolution of methods and devices in this field, the present concepts are believed to represent substantial new and novel improvements, including departures from prior practices, resulting in the provision of more efficient, stable and reliable methods and devices of this nature.

The teachings of the present invention permit the design of improved methods and apparatus for ultra fast assessment of magnetic elements with high controllability.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
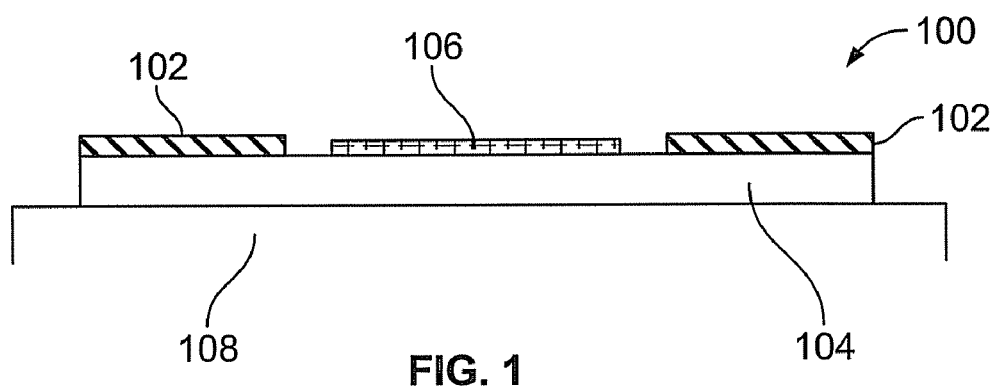
FIG. 1 to FIG. 4 show four different practical embodiments of a device for ultra fast assessment of magnetic elements, wherein the magnetic element is not in direct contact with the SAW generating means, according to the first embodiment of the present invention.

In the different figures, the same reference figures refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

For the purpose of the present invention the expression 'A in contact with B' refers to spatial and/or structural configurations of A and B for which the propagation of surface acoustic waves and/or strain waves between A and B is possible.

In a first embodiment a device 100 for switching and/or determining and/or manipulating and/or changing a magnetisation state of a ferromagnetic component is described. The device 100 comprises a surface acoustic wave (SAW) generating means 102, a transport layer 104 to allow propagation of the generated SAW and in which a SAW has the form of a stress and/or strain wave, and a magnetic element 106, also called magnetic cell or cell, whose state can be switched or determined or assessed using the stress and/or strain wave. Strictly spoken, the transport layer 104 is also part of the SAW generating means 102. Surface acoustic waves are generated by the SAW generating means 102 and need a material for their transfer, which is the transport layer 104. Therefore, the SAW generating means 102 and the transport layer 104 belong together. However, for the ease of explanation, in the further description, the SAW generating means 102 and the transport layer 1041 will be discussed separately. According to the present invention, the magnetic element typically consists of ferromagnetic material, having a typical ferromagnetic resonance frequency. Although the device 100 can be adjusted to work in other frequency ranges, the RF frequencies typical for FMR materials are interesting as they allow high speed switching, sensing, etc. The SAW generating means 102 can be e.g. an inter digitated transducer (IDT) which is deposited on and hence is in physical contact with a transport layer 104. However, the invention is not limited thereto. The SAW generating means 102 may furthermore be for example a laser, for instance deposited on a transport layer 104, whereby SAW's are generated by laser pulses.

IDT's are known from their use as RF-filters. They have reached a stage beyond development, and are widely used products. They are, even in the several GHz region, a commercially available product, known by the person skilled in the art. Although in principle all types of surface acoustic waves can be used, the SAW choice can be mainly reduced to the distinction between Rayleigh and shear waves, i.e. SAWs which are perpendicular to the surface plane and SAWs which are in-plane. The transport layer 104 may typically comprise a piezoelectric material or preferably is made of piezoelectric material, but can also be any other material in which the propagation of a SAW is possible and wherein the SAW wave has the character of a strain wave. The magnetic element 106 to be addressed is positioned on top and in physical contact with the transport layer 104. In the present embodiment, the magnetic element 106 is not in contact with the SAW generating means 102, i.e. it is isolated therefrom. The magnetic element 106 may be part of a magnetic component. A broad range of magnetic components may be used with embodiments of the present invention such as e.g. tunnel junctions, spin valves, single layers, . . . . A typical example of a magnetic component that can be used is an MRAM device. The choice of the magnetic element 106 and possibly the magnetic component used in the device 100 according to the present invention, depends on the application.

In order to use the device 100 described above, i.e. to switch or assess or determine the state of or manipulate the state of the magnetic element, the following method is used. The SAW generating means 102 generates a SAW with a certain frequency $v_{SAW}$. This SAW is propagating further into the transport layer 104, which is in physical contact with the SAW generating means 102. The SAW generates a time dependent strain at every spot of the transport layer 104. Since the magnetic element 106 or cell is placed in physical contact with the transport layer 104, the strain wave, which has been induced by the SAW, will propagate also into the magnetic element 106. The strain wave generates an associated effective magnetic field in the magnetic element 106, which can interact with the magnetisation state of the cell. Interacting with a magnetisation state of a magnetic element 106 can be for instance mean assessing, determining, manipulating or changing the magnetisation state. It has been found that magnetic elements 106 have the capability of efficiently absorbing SAWs, i.e. are influenced efficiently by the corresponding strain wave, when their frequency is close enough to the FMR frequency of the magnetic element 106. This energy-loss will be converted in the magnetic element 106 which can be part of a layer in a change in magnetic state. In other words, the SAW, generated by the SAW generating means 102, generates the necessary strain for the magnetic element(s) 106 to change its magnetisation state.

So, RF-SAW devices can be used to apply the necessary stimulus to operate magnetic layers at their FMR frequencies, and altering their properties, which may be especially the magnetisation direction but also may be other properties as e.g. switching behaviour, coercivity, biasing, permeability, susceptibility, damping or absorption behaviour. The latter can be made visible by the width of the absorption peak. These properties all are related to the magnetisation, i.e. magnetisation state of the magnetic element. This altering of properties allows to switch or assess or determine the magnetisation state of a magnetic element at very high frequencies, i.e. typically above 1 GHz. Thus instead of using external magnetic fields, the present invention discloses a novel method which uses magneto-elastic energy conversion to change the magnetisation state of the ferromagnetic element 106, or in other words, this solution uses magneto-elastic energy conversion between a magnetic element 106 and a SAW in a piezoelectric layer to interact with the magnetisation state of the magnetic element 106.

Different configurations can be provided for the device 100 according to the present invention. These configurations can be determined by the choice of SAW type, i.e. Rayleigh and/or shear SAWs, the way the piezoelectric material is provided and the magnetic element 106 chosen. Some preferential configurations combining specific choices are shown in FIGS. 1 to 4. Nevertheless, the present invention is not limited by the configurations shown, but only by the claims.

Figure 2:
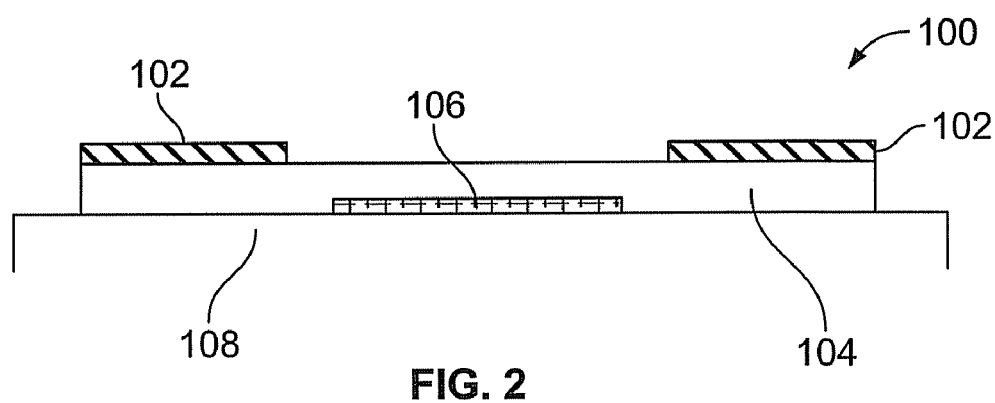
Figure 3:
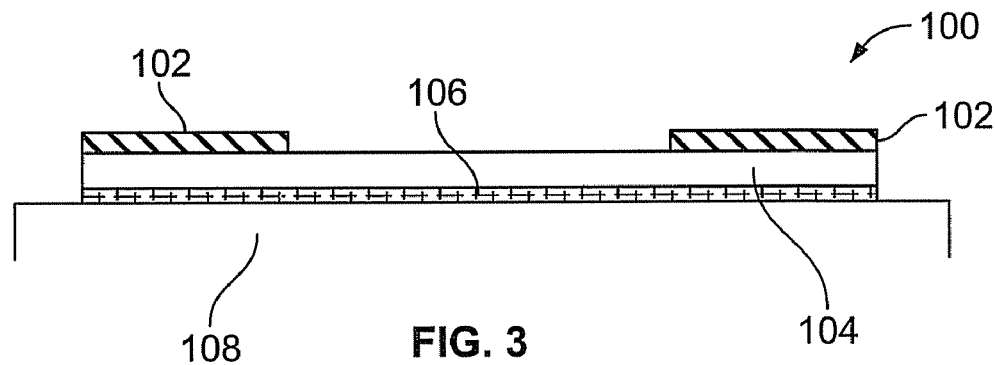

In FIG. 1 to FIG. 3 a transport layer 104, being a piezoelectric film, is deposited on a substrate 108. This substrate 108 may be any substrate possible, such as glass or any type of plastic, or a semiconductor substrate, such as silicon or germanium, GaAs, . . . . The piezo-electric film may be made of any piezo-electric material in which the creation of a SAW, corresponding to a stress wave with associated creation of stress and/or strain in the film, is possible, such as e.g. GaN or quartz. Furthermore in FIG. 1, the SAW generating means 102 and the magnetic element 106 both cover different parts of the piezo-electric film, such that the SAW generating means 102 and the magnetic element 106 are at least partly in the same plane. In principle a single SAW generating means 102 is sufficient to generate the necessary stress in the piezo-electric film and consequently in the magnetic element 106 to influence its magnetisation state. In the specific configurations described, at least two SAW generating means 102 are provided, which can be positioned at each side of the magnetic element 106, preferably, but not necessary, symmetrically.

In FIG. 2, the magnetic element 106 is patterned and buried by the piezo-electric film or transport layer 104, i.e. between the piezo-electric film or transport layer 104 and the substrate 108, while the SAW generating means 102 still are on top of the piezo-electric film or transport layer 104.

In FIG. 3 a non-patterned magnetic element 106, i.e. a full layer, is shown extending between the substrate 108 and the piezo-electric film or transport layer 104, whereby the SAW generating means 102 still are on top of the piezo-electric film or transport layer 104.

Figure 4:
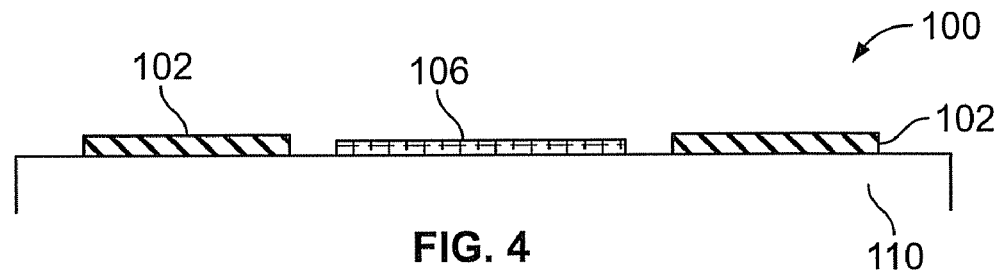

Another configuration is shown in FIG. 4 whereby the piezo-electric material is provided as a substrate 110. This substrate 110 may consist of any piezo-electric material in which the creation of a SAW, corresponding to a stress wave with associated creation of stress and/or strain in the film, is possible, such as e.g. GaN or quartz. The SAW generating means 102 and the magnetic element 106 can then be positioned or deposited on top of the piezo-electric substrate 110 in a patterned way. It may be advantageous that there is no direct physical contact between the SAW generating means 102 and the magnetic element 106, as depicted in the configurations of FIG. 1 to FIG. 4. The latter may e.g. allow to avoid shortcutting the IDTs. Since the electric field used to generate a SAW has to be applied between distinct transducers, no shortcuts between the fingers are allowed. Furthermore, in certain embodiments it is advantageous that the magnetic elements are not under the same electric field as the IDTs. This makes their individual assessment more straightforward.

In another viewpoint this can be seen as a need for the SAW and associated stress wave to have a transport means or layer to reach the magnetic element, since a SAW generating means is mostly not able to generate a SAW directly in such a magnetic element, as is for instance the case for an IDT.

Figure 5:
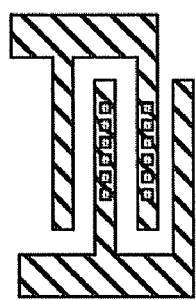
FIG. 5 to FIG. 8 show four different practical embodiments of a device for ultra fast assessment of magnetic elements, wherein the magnetic element is in direct contact with the SAW generating means, according to the second embodiment of the present invention.
Figure 5:
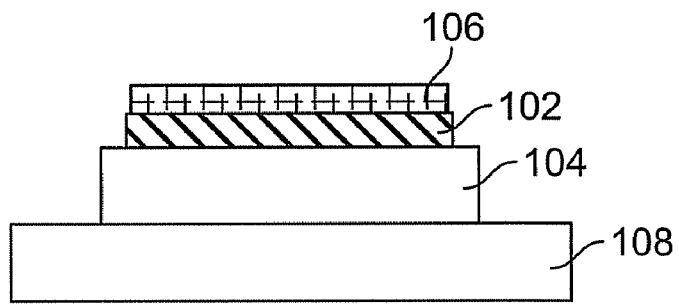
Figure 6:
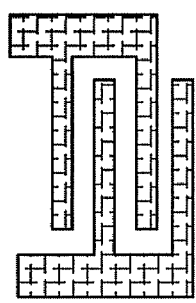
Figure 6:
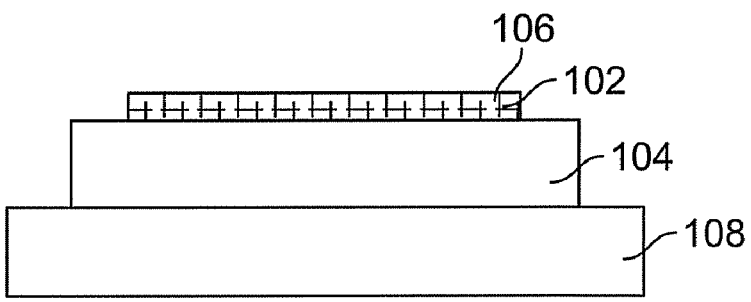
Figure 7:
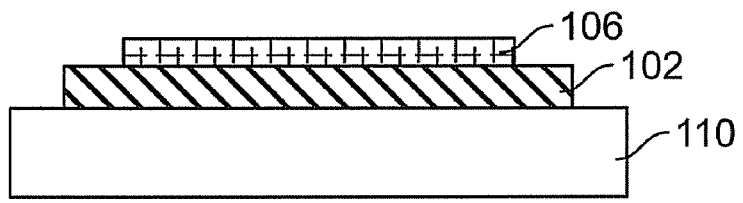
Figure 8:
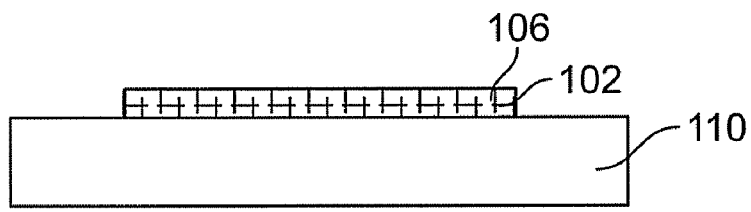
Figure 9:
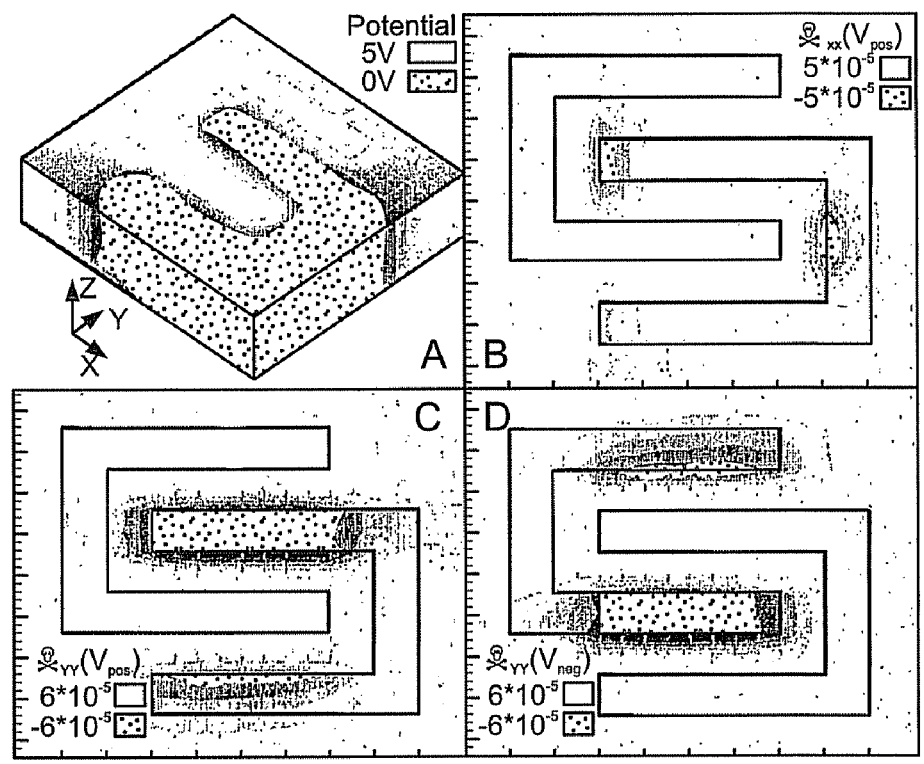
FIG. 9a to FIG. 9d shows simulation results for a device wherein strain is generated in the SAW generating means, according to the second embodiment of the present invention.
Figure 10:
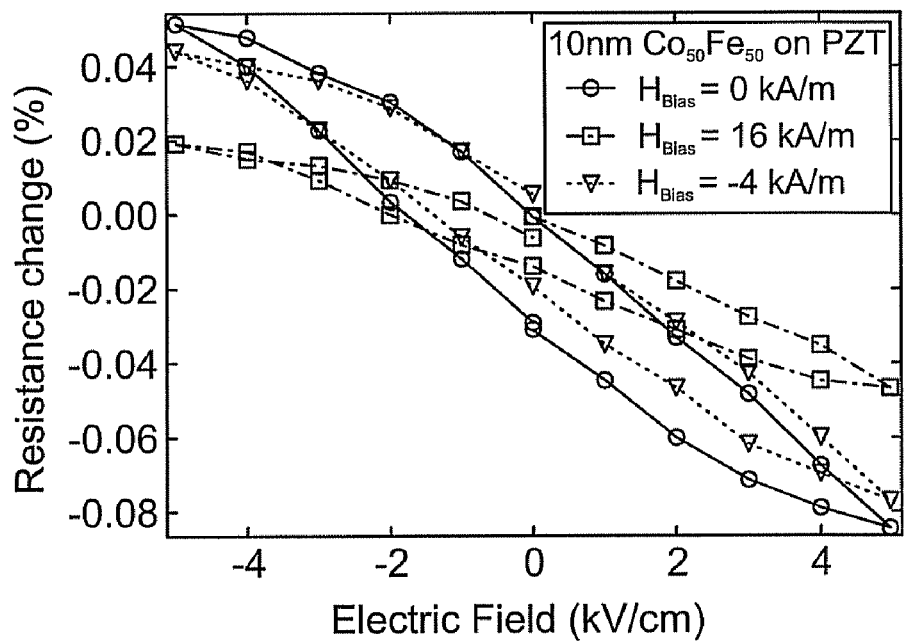
FIG. 10 shows the resistance change in a SAW generating means being a magnetic IDT as a function of the electric field applied to it, as used in the second embodiment of the present invention.

In a second embodiment, the invention relates to a device 100 for switching and/or determining and/or manipulating and/or changing a magnetisation state of a ferromagnetic component, comprising the same components and functionalities as described in the first embodiment, but wherein the magnetic element 106 is in direct contact with the SAW generating means 102, such as e.g. the IDT or wherein the IDT is itself the magnetic element 106 of interest. The magnetic element 106 in direct contact with the SAW generating means 102 may e.g. be deposited directly on top of the SAW generating means 102. Such configurations are depicted in FIG. 5 to FIG. 8. FIG. 5 indicates the configuration wherein a magnetic element 106 is deposited on top of a SAW generating means 102 whereas FIG. 6 indicates the configuration wherein the magnetic element 106 of interest is the SAW generating means 102 itself. In both configurations a transport layer 104 and a substrate 108 is present. FIG. 7 and FIG. 8 indicate similar configurations wherein the substrate 110 is a piezo-electric material, thus avoiding the need for an additional transport layer 104. In these configurations, the SAW generating means 102 generates a SAW and associated stress wave in the transport layer, which may be part of the SAW generating means 102 or part of the substrate 110. This stress wave is felt by the SAW generating means 102, an effect which has been experimentally proven for an IDT. The SAW generating means 102 deforms under such stress exertion and generates a stress in the magnetic element in direct contact with the SAW generating means 102. In case the magnetic layer of interest is the SAW generating means 102, e.g. IDT, itself, the stress is directly sensed. Experimental data supported by simulations indicate that strain is generated in the saw generating means 102, e.g. IDTs. The corresponding simulation results are shown in FIG. 9. FIG. 9a shows a configuration having 2 sets of 2 fingers and the potential they feel at a certain moment, determined by the maximum amplitude of the SAW generating electric field of the SAW. FIG. 9b and FIG. 9c represent the strain in the length, respectively the width direction of the fingers for the potential as depicted in FIG. 9a. FIG. 9d shows the strain in the width direction for the inverse potential. These figures show that the fingers experience an alternating strain, corresponding to the stress a SAW generates in a layer on top of it. Depositing a magnetic element directly on top of an IDT couples the strain generated in the IDT to the magnetic element, thus giving the necessary stimulus. FIG. 10 shows the resistance change in a magnetic IDT in function of the electric field applied to it. The strain effectively couples in the magnet to the magnetic properties (AMR effect), demonstrating the possibility to use the IDT as magnetic element of interest.

The present invention offers different advantages. There is no need for the use of large currents to create a magnetisation switch, nor is their a need for using reference cells. Furthermore, it provides less stringent timing issues and allows for simultaneous read and write possibilities. No external fields are needed. Moreover, in most applications, no exact read-out value is necessary, just the phase.

Figure 11A:
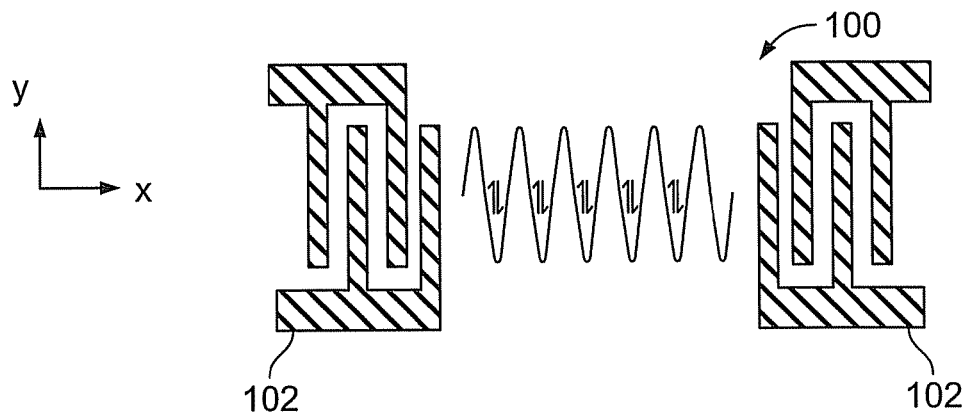
FIG. 11a is a schematic representation of a shear SAW generating means.

In a third embodiment, a device 100 according to, i.e. having the same components as, any of the configurations described in the previous embodiments is provided, whereby the SAW generating means 102 can apply a shear SAW. A shear SAW, as depicted in FIG. 11a, is a surface acoustic wave that is launched by a SAW generating means 102, e.g. an IDT, and that makes the surface deform in a sinusoidal manner in plane (X-Y plane), generating a shear strain on every spot where the SAW passes. The magnitude of the shear strain, at given time and place, is depending on several parameters, from which the most important are the voltage applied on the SAW generating means 102 and the phase of the wave. So, a layer deposited in the path of the SAW, at its fixed location, senses a shear strain which changes in magnitude over time.

Figure 11B:
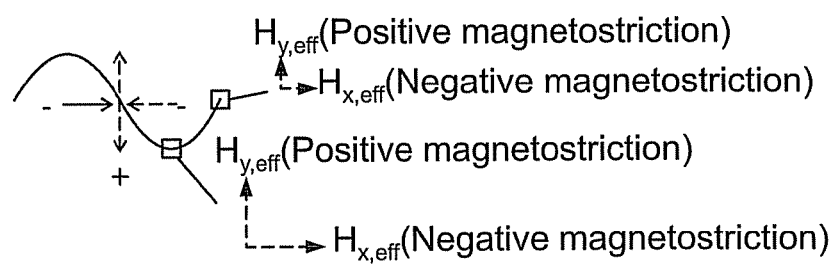
FIG. 11b is a schematic representation of the stress and/or strain wave induced in the magnetic element and the corresponding effective magnetic field components created according to the present invention.

If this layer is a ferromagnetic layer, then the shear strain generates an effective magnetic field in the layer, as shown in FIG. 11b. As the magnetic elements 106 are placed on top and in physical contact with the transport layer 104 which experiences a strain wave or in direct contact with the SAW generating means 102 which experience a strain wave, the magnetic element 106 in the different embodiments of the present invention will experience the strain wave, and the induced associated effective magnetic field. More in detail, the shear strain can be decomposed in compressive and tensile strain components, as shown in FIG. 11b. These components can be represented by a component parallel with the easy axis of the magnetic element 106 and a component transversal on this component. The easy axis defines the preferred magnetisation direction of the magnetic material. Consequently, a strain component parallel and a strain component perpendicular to this axis can be distinguished. This strain will induce an associated magnetic field in the magnetic element 106.

Figure 11C:
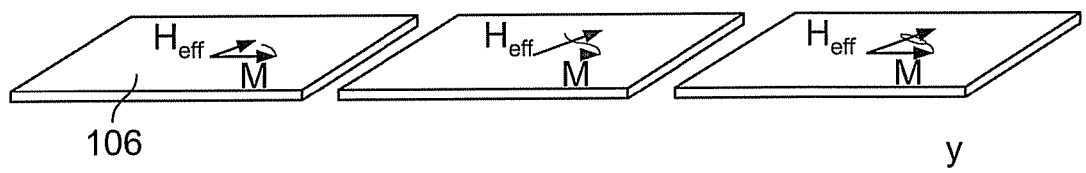
FIG. 11c is a schematic representation of the change of magnetisation induced by the shear SAW in a device according to the present invention.

Depending on the sign of the magneto-striction of the magnetic material 106, which is a typical material characteristic, the strain induced by the SAW generates a field in the x-direction if the material has a negative magneto-striction coefficient or a field in the y-direction if the material has a positive magneto-striction coefficient. Considering that the magnitude of the strain is time-dependent, also the magnitude of the effective field changes in time. This causes a change in magnetisation and overall magnetic properties. If this SAW activation is performed at or near the FMR frequency of the magnetic material 106, then absorption of the SAW will be higher, and the magnetisation will be able to respond in similar way as shown in FIG. 11c. It is to be noted that no assumptions are made on magneto-striction nor on easy axis direction as compared to the wave direction. In the left drawing of FIG. 11c the SAW begins to act on the magnetisation. Since the beginning of the SAW has a small amplitude, the magnetisation will be drawn towards the direction of the effective field. As the strain gets higher, the rotation of the magnetisation gets faster and has an overshoot, as shown in the central drawing of FIG. 11c. Then, by lowering the strain until zero, the magnetisation will return and eventually start precessing around the effective field, as shown in the right drawing of FIG. 11c.

In the description of the effect of a shear strain wave on the magnetisation, the magnetic element 106 has been considered as infinitesimally small, which is an ideal case. In practice a similar behaviour can be obtained by making the elements 106 as small as possible with respect to the wavelength of the SAW $\lambda_{SAW}$. Choosing such small sizes implies that the strain is comparably large or essentially the same at all positions within 1 cell. Bigger sizes of cells will have a strain and thus an induced effective magnetic field which will differ substantially between two points in a cell. In other words these larger sizes will have inhomogeneous magnetisation distributions, resulting in magnetisations that will be rotating in periods, as dictated by the SAW wavelength $\lambda_{SAW}$. Problems should not arise for element sizes smaller than ¼ the wavelength of the SAW.

Figure 12:
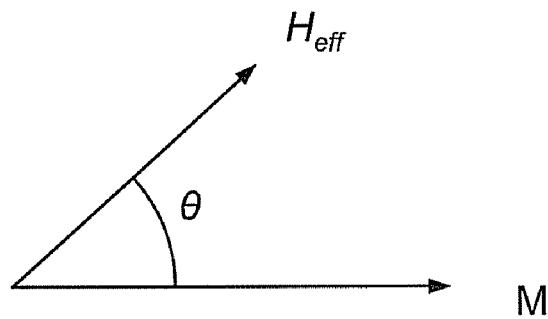
FIG. 12 is an illustration of the effective magnetic field induced by a SAW and the magnetisation of a magnetic element in a device according to the present invention.

An important parameter of this activation is the angle θ between the easy axis of the magnetic layer 106, and the direction of the effective field, as shown in FIG. 12. Maximum response is obtained for the angle that maximises the momentum, i.e. θ=90°. For θ=0°, no effect will be observed as the magnetisation is already in the direction of the generated effective magnetic field. For a material with negative magneto-striction this implies that the magnetic material should be put with the easy axis perpendicular to the SAW direction. A positive magneto-strictive material requires an easy axis parallel to the SAW direction. In general; for negative magneto-striction material, the easy axis should be not parallel to the SAW direction, for positive magneto-striction material the easy axis should be not perpendicular to the SAW direction.

If e.g. a magnetic material with a negative magneto-striction is used, a tensile stress causes an effective magnetic field that is perpendicular to the direction of the stress, while a compressive stress causes an effective magnetic field parallel to the direction of the stress. In FIG. 11*b* it is illustrated that strain wave in the x direction creates compressive stress along the x direction, while the tensile stress occurs along the y direction. This implies that the magnetic field, created by both stress components is oriented along the x-direction. The effect of the effective magnetic field on the change in magnetisation orientation depends on the angle between the direction of the effective magnetic field and the direction of the magnetisation. In this case, maximum effect will be obtained if the easy axis is along the y direction, i.e. perpendicular to the x-direction, which is the direction of the effective magnetic field. The magnetisation direction thus should be perpendicular to the strain wave direction. For positive magneto-striction materials, the magnetisation direction should be parallel to the strain wave, based on a similar deduction.

Thus the application of a shear SAW allows to directly access the FMR frequency of a magnetic layer/component 106, thus altering its properties, i.e. switching behaviour, coercivity, biasing, susceptibility, absorption behaviour leading to e.g. damping . . . , at RF frequencies, i.e. frequencies higher than 1 GHz.

Figure 13A:
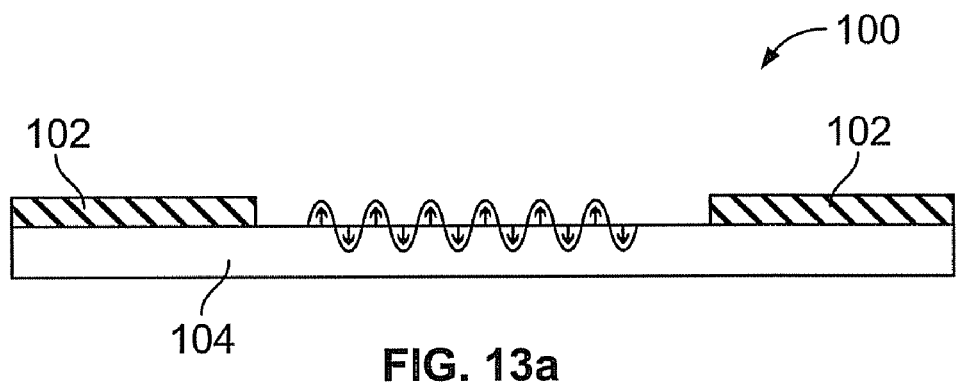
FIG. 13a is a schematic representation of a device according to the present invention wherein a Rayleigh SAW is induced.
Figure 13B:
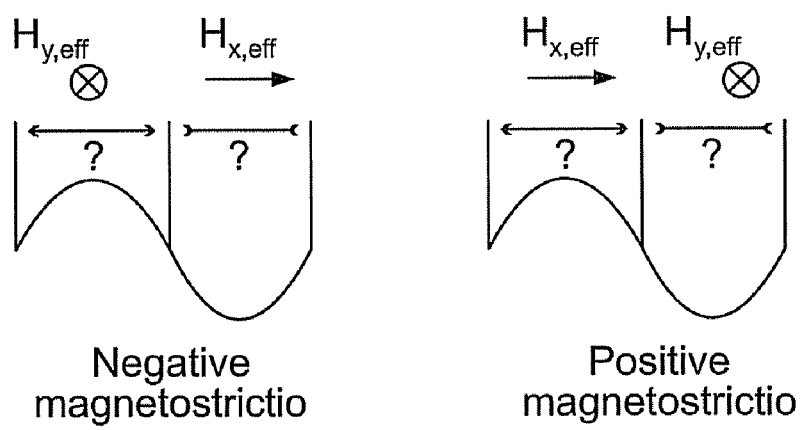
FIG. 13b is a schematic representation of the induced stress and/or strain and the effective magnetic field components in a device according to the present invention.
Figure 13C:
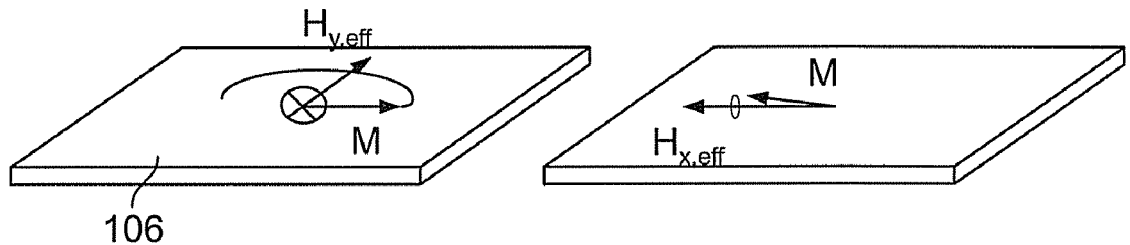
FIG. 13c is a schematic representation of the change of magnetisation induced by a Rayleigh SAW in a device according to the present invention.

In a fourth embodiment, a device 100 according to, i.e. having the same components as, any of the configurations described in the first or second embodiment is provided, whereby the SAW generating means 102 are adjusted to apply a Rayleigh SAW. A Rayleigh SAW, as depicted in FIG. 13*a*, is a surface acoustic wave that is launched by a SAW generating means 102, e.g. an IDT, and that makes the surface deform in a sinusoidal manner perpendicular to the plane, generating a strain on every spot where the SAW passes. The magnitude of the Rayleigh strain, at given time and place, is depending on several parameters, from which the most important are the voltage applied on the SAW generating means 102 and the phase of the wave. So a layer deposited in the path of the SAW, at its fixed location, senses an in magnitude, as well as in sign, changing strain. If this layer would be a ferromagnetic layer 106, then the strain would generate an effective magnetic field in the layer, as shown in FIG. 13*b*. For a Rayleigh wave passing through a ferromagnetic material at a certain position, the wave first causes a tensile stress in the magnet (first half period), followed by a compressive stress in the second half period. For a negative magneto-strictive material this causes, first, an effective field perpendicular to the SAW direction (y-direction), followed by a field in the direction parallel to the SAW (x-direction). For a material with positive magneto-striction the directions are opposite. If this SAW activation is performed at FMR frequency of the magnetic material, then absorption of the SAW will be higher, and the magnetisation will be able to respond in a way as shown in FIG. 13*c*. The situation shown is the case for negative magneto-strictive material and the first period of a SAW, or for a positive magneto-striction material and the SAW shifted 180 degrees. In the left drawing of FIG. 13*c* the SAW acts, by means of its induced effective magnetic field, on the magnetisation in the y-direction. This causes the magnetisation to rotate around the effective field and hence coherently switch the magnetisation. When the material is switched, the SAW applies a field in the direction of the easy axis (x), and the magnetisation relaxes around its switched equilibrium, as shown in the right drawing of FIG. 13*c*.

An advantage of switching like this is the less stringent requirements on timing, compared to magnetic field-induced switching by current carrying conductors. If for example the frequency of the SAW is not close enough to the FMR frequency, then the magnetisation won't be exactly switched, but has passed the switching threshold, when the second period begins, or the magnetisation will have overshot the equilibrium position by an amount that wouldn't cause the magnetisation to return to its initial value. Here the field in the x-direction plays an important role in returning the magnetisation to the switched position. This effective field pulls the magnetisation in the x-direction, hence stabilising the switching and lowering the ringing through an improved damping mechanism. By ringing is meant that the magnetisation rotates around the direction of an equilibrium state, which typically will be the direction of the easy axis. The damping of the magnetisation, i.e. the relaxation to its equilibrium state, is accelerated by applying an effective magnetic field in the direction of the equilibrium state. This description of the effect of a Rayleigh strain wave on the magnetisation is made for an element that is infinitesimally small. In practice a similar behaviour can be obtained by making the elements as small as possible with respect to $\lambda_{SAW}$. Choosing sizes like this implies that the SAW or strain wave is comparably large at all positions. Larger sizes will have inhomogeneous magnetisation distributions, the magnetisations will be rotating in periods, as dictated by the SAW period. Problems should not arise for element sizes smaller than ¼ the period of the SAW.

An important parameter of this activation is the angle between the easy axis of the magnetic layer 106, and the phase of the strain wave. For a material 106 with negative magneto-striction this implies using the first period of a sine and putting the easy axis parallel to it. A positive magneto-strictive material requires an easy axis perpendicular to the SAW when using the first period. This is obtained based on the same principles as discussed for the shear wave. This is due to the fact that, for e.g. a negative magneto-strictive material, in order to obtain an optimum magnetic moment, the easy axis has to be perpendicular to the effective magnetic field. As during the first half period of the wave, the effective magnetic field is oriented perpendicular to the direction of the SAW wave, the latter being the x-direction, the easy axis thus has to be in parallel with the SAW direction. This can be seen in FIG. 12. For a positive magneto-strictive material, the effective magnetic field during the first half period is oriented in the x-direction and thus the easy axis should be oriented in the y direction.

Thus, the application of a Rayleigh SAW allows to directly access the FMR frequency of a magnetic layer/component 106, thus altering its properties, i.e. switching behaviour, coercivity, biasing, susceptibility, permeability, . . . , at RF frequencies.

It will be obvious to the person skilled in the art that other configurations are possible, e.g. by changing the position of the SAW generating means 102, e.g. placing them in the y direction instead of the x direction. The positioning of the magnetic elements 106, and more specifically their easy axis, then also changes mutatis mutandis.

In a further embodiment, an in-plane magnetic sensor 200 is described working also at frequencies higher than 1 GHz. The magnetic sensor 200 can be used for detection of several different parameters. Here the application of stress sensors as well as field sensors will be treated as the same type, because, by magneto elastic interaction, they are generally interchangeable. The main difference is the lack of sense for strain. A magnetisation points in one specific direction, but stress works in both senses, for instance + and −x-direction.

Figure 14A:
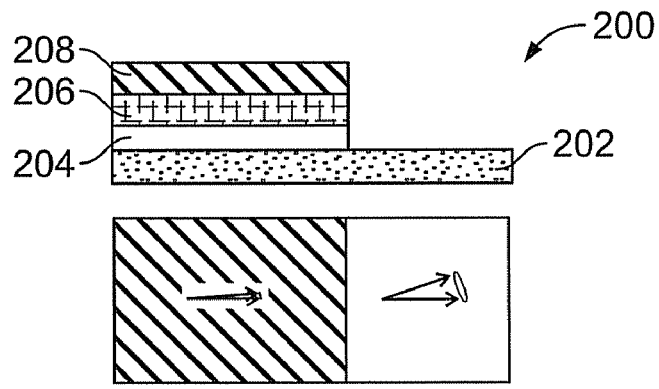
FIG. 14a illustrates an in-plane magnetic sensor also for use at frequencies higher than 1 GHz, according to the present invention.
Figure 14B:
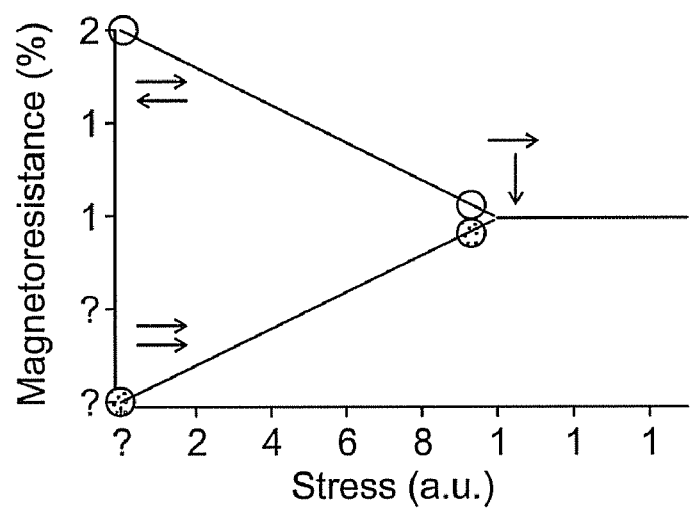
FIG. 14b is a graph representing the evolution of the magneto-resistance as a function of stress, for a magnetic element in a device according to the present invention
Figure 14C:
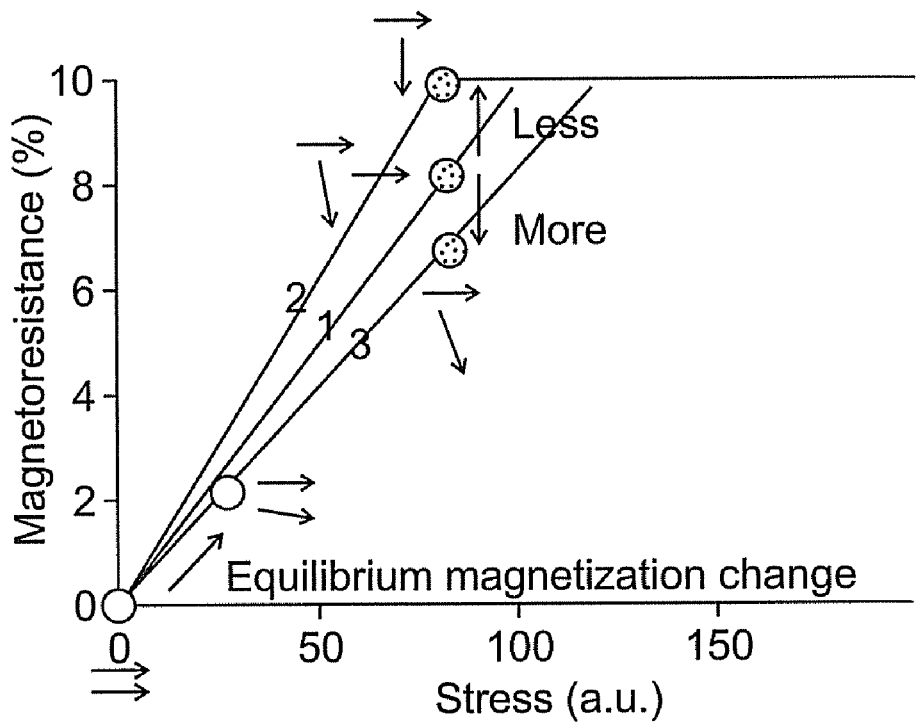
FIG. 14c is a schematic representation of the influence of the amount of anisotropy in a magnetic element in a device according to the present invention.

The effect of a SAW on a magnetic sensor 200, which as example is a spin valve, but may also be for example a tunnel junction or AMR-sensor, . . . is to constantly access its magnetisation. The sensor 200 is e.g. a spin-valve and may comprise a sensing layer 202, a barrier layer 204, a second layer 206 and a biasing layer 208. The perturbation given to a single sensor element 200 is that the free layer rotates its magnetisation between two states, determined by the angle of the effective field (stress related) and its magnitude. This is shown in FIG. 14a. This translates to a change in resistance through the Magneto Resistance-effect (MR-effect) as shown in FIG. 14b. By monitoring of the change in resistance, information about the sensor is obtained. So, when the sensor 200 is placed in a changing environment, its properties change, including its response to the activating SAW. In FIG. 14c, the change response is shown. As can be seen, two main properties change: the slope of the response, and therewith the magnitude, and the initial point. The slope of the response is depending on the amount of anisotropy in the equilibrium direction. This means that when a component has more anisotropy in its equilibrium state, it is harder to activate it with the SAW. This corresponds to a decreasing slope, hence causing a lower response of the sensor 200 on the SAW. The second change is related to the equilibrium direction. If this is no longer aligned with the easy axis of the sensor 200, the sensor 200 doesn't return to its parallel sensing layer-fixed layer position. These two parameters are a measure for the change of environment.

In other words, a magnetic component, spin-valve or tunnel-junction is constantly given small angle perturbations to its magnetic state. All changes in anisotropy, caused by e.g. external fields, stress, . . . , will change the response of the components. By looking at this response a conclusion can be drawn concerning the amount of anisotropy in the system, as well as its direction. These two properties give a measure for the changes in environment. This principle can be used in ultra fast magnetic field sensors, stress sensors, etc.

Figure 15A:
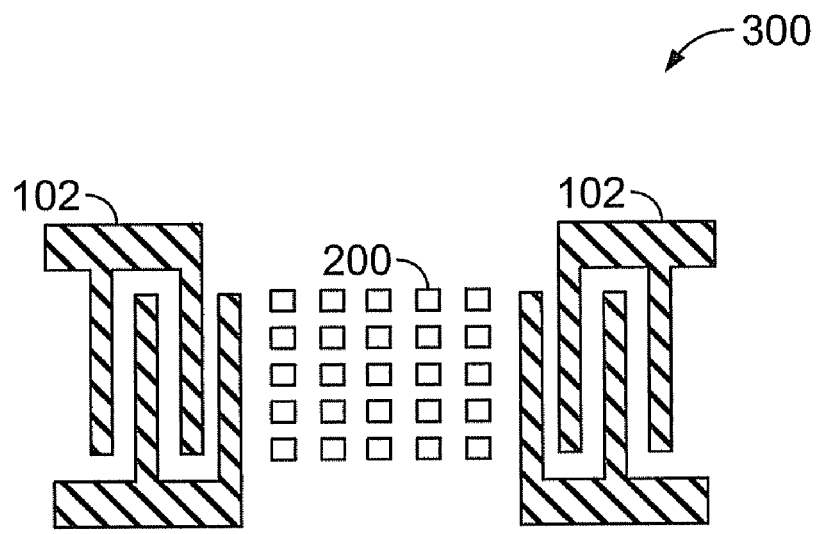
FIG. 15a is a schematic representation of a density of magnetic components between a SAW generating means according to an embodiment of the present invention.

The previous explanation implies that the size of the sensor 200 is small enough to have the magnetisation respond in a spatially uniform way to the SAW excitation. Preferably sizes of up to a quarter of the wavelength of the SAW are used. When a larger sensor is required, a patterned and series connected sensor can be used. Such a sensor 300 is shown in FIG. 15a. This avoids that the spin wave generated in the large sensor creates an MR-response that is averaged to zero, which could be the case if a single-entity large component is used. Alternative embodiments, whereby the sensor is in direct contact with the SAW generating means, in agreement with the second embodiment, also can be used.

An advantage of using a patterned component according to the present invention is that a magnetic camera with micron resolution can be constructed. By separately reading out the composing sensors, a 2-D image of the magnetic environment can be generated. Since the read-out is done at frequencies higher than 1 GHz, $10^9$ elements can be read-out per second, one at a time. This makes it a fast, high-resolution sensor.

A problem that can arise both in a bulk sensor, which can comprise a series of sensors, and in a camera is that the frequency of FMR shifts with altering environmental properties. To avoid this, a feedback scheme can be provided to solve this problem. Moreover, the frequency shift can be a measure for the magnitude and direction of a global effective field present in the camera or bulk sensor. By adding this to the small-field response measured by the separate sensors, a large range sensor operation can be assured.

The present invention also relates to a read-out scheme for exchanged biased spin-valve or tunnel-junction structures. The exchange biased spin-valve or tunnel-junction read-out scheme is directly based on the effect of a surface acoustic wave on magnetic materials. A possible configuration is shown in the device 300 of FIG. 15a. Here several components 200 are deposited between the SAW generating means 102 such as e.g. IDTs, generating the SAW. The density of these components 200 depends on considerations made when describing the effect of SAWs on ferromagnetic materials. Hence, the elements can be easily placed at a pitch of a quarter of the wavelength of the SAW. This is in its turn dictated by the FMR frequency of the magnetic element. A typical value for some typical materials is approximately 2 micron. This allows to obtain a density of $25 \times 10^6$ elements/cm$^2$.

Figure 15B:
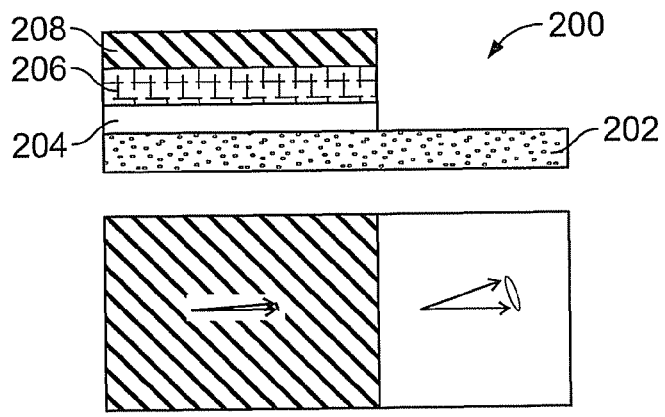
FIG. 15b is a schematic representation of a magnetic component, i.e. for example a spin valve, according to the present invention.
Figure 15C:
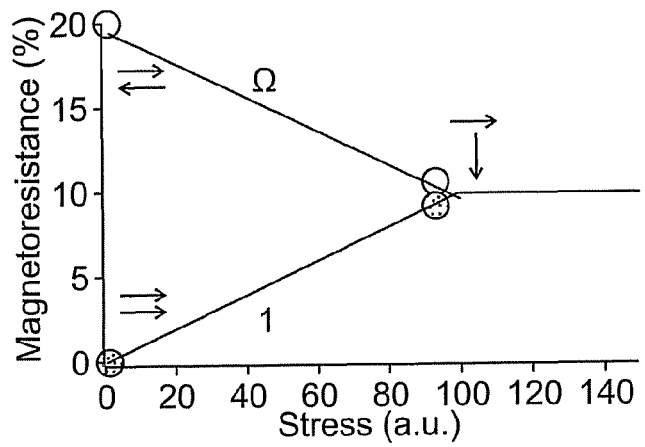
FIG. 15c is a graph of the magneto-resistance as a function of stress for a spin valve magnetic component according to the present invention.
Figure 15D:
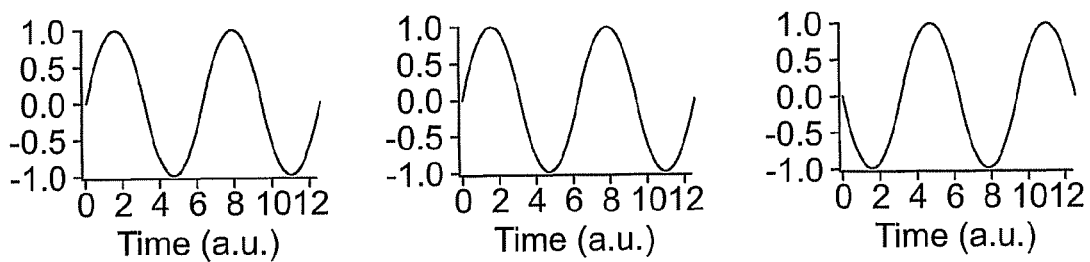
FIG. 15d is a schematic representation of the response of a magnetic element in the "1" state, i.e. for parallel magnetisation of the layers, (central graph) and the response of a magnetic element in the "0" state, i.e. for anti-parallel magnetisation of the layers, (right graph) for a distinct surface acoustic wave (left graph).

The effect of a SAW on a magnetic component 200 is depicted in FIG. 15b. In this figure the different composing layers for the components are shown. The materials used for different magnetic elements differ, i.e. for example for tunnel-junctions the barrier is most common to be an oxide, whereas for a spin-valve this is a non-magnetic metal. A SAW causes a perturbation of the magnetisation, which is different for different ferromagnetic layers. This depends on the properties of the magnetic material. Choosing a stress-sensitive material, i.e. a material having a high magneto-striction to amount of anisotropy ratio $\lambda_S/K_u$, as sensing layer 202 and a stress-insensitive material, i.e. a material having a low magneto-striction to amount of anisotropy ratio $\lambda_S/K_u$ as second layer 206, allows that the magnetisation is only affected in one layer. An example of a corresponding component is shown in FIG. 15b, wherein the bottom layer of the structure is a sensing layer 202 and the second layer 206 is a stress-insensitive layer. These material properties are also valid for the sensor embodiment according to the present invention. A barrier layer 204 also is provided. The anti-ferromagnetic layer is included in the stack to bias the component 208. This layer should also be stress-insensitive. The activation can be done by both shear as Rayleigh waves. Care should be taken not to switch the component, hence destroying its state. The way the perturbation is perceived is shown in FIG. 15c. In the figure, a magneto resistance measurement is shown. This depicts the change in resistance in function of the applied stress. This stress can be generated by a SAW. There are two possible states for the component to be in. The bottom rising line belongs to the "1" state, i.e. for parallel magnetisation of the layers, the top descending line belongs to the "0" state, i.e. an anti-parallel configuration of the layers. If a SAW, having a form as shown in the left figure of FIG. 15c is passed through the component, there are two possibilities. If the spin-valve is in the "1" state, the effective field causes a resistance change as shown by the dark grey markers. This gives a resistance change as shown in middle picture of FIG. 15c. A "0" gives a resistance change that is in anti-phase with the activating signal, as shown in the right picture of FIG. 15c. By comparing phases of the input and output signal, a read-out can be made, without the need for an absolute resistance measurement, nor the need to compare the output with a reference cell. The phase of the input signal can be easily derived by calculation.

The present invention furthermore relates to a scheme or method for switching of magnetic components. This follows directly from the effect of the SAW on the magnetic material. The method is based on any of the devices presented in the first, second or third embodiments. Small differences occur depending on the choice between a shear wave or a Rayleigh wave.

If a shear wave is used, the wave can give an impulse to the magnetisation, the momentum being maximum when the angle between the magnetisation direction and the effective field is 90 degrees. When applying the SAW, a perturbation to the magnetisation will be given. The magnitude hereof is depending on the applied voltage in the SAW creating means. Above a certain threshold voltage, i.e. above a certain magnitude of the SAW, the magnetisation precession will rotate far enough to have the magnetisation closer to the anti-parallel magnetisation direction. This implies that, when the activating SAW is turned off, the magnetisation will relax towards a switched equilibrium. With this switching method, timing becomes an important factor. Switching the SAW on and off (or increasing and decreasing its magnitude) should be done at the exact right time, to avoid not reaching the switching threshold or overshooting the switched position.

If a Rayleigh wave is used, an impulse is also given. The impulse has two perpendicular effective fields as response. Switching occurs by applying a large enough magnitude of SAW, hence in the first half period precessing the magnetisation to the switched position, and consequently pulling the magnetisation towards the switched position. Timing is in this case less of an issue, since the entire second half period of the SAW satisfies the switching criteria. This implies that for switching, the Rayleigh waves configurations are the most effective and easy to implement.

Figure 16:
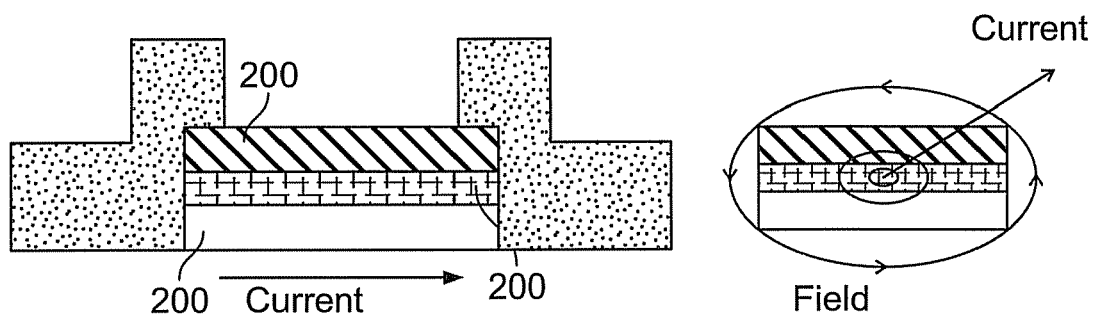
FIG. 16 gives a schematic representation of a switching scheme for magnetic layers and components through SAW activation, according to the present invention.

The above description referred to single elements. When an array of magnetic components 200 needs to be addressed, an additional parameter has to be included, which is element specific. Therefore, the read-out contacts 210 can be used, as shown in FIG. 16. Sending a current through the element, e.g. a spin valve as shown in FIG. 16, generates a magnetic field, that can help switching by lowering the anisotropy in the easy axis direction. So, to avoid switching all the elements simultaneously, a SAW magnitude is chosen that lies at a safe distance, i.e. to avoid unintended switching, below its threshold value. The field generated by the current lowers this threshold below the SAW amplitude, so switching the selected element. Except for the element specificity of this approach, timing issues can be approached differently. It is not the SAW which has to be timed (what can be difficult because of the nature of SAWs, and its response to single pulses), but the selecting current is to be timed. This is especially an improvement for the shear waves. Another advantage that comes from this scheme is the fact that several different operations can be combined. The SAW used causes perturbations required for the read operation, as well as for writing. Only the magnitude of the read/write current is determining whether reading or writing is selected. Moreover, different write operations can be done together. Thus a switching scheme for magnetic layers and components illustrates activation through SAW. At FMR frequency the magnetic layer/component can be given a large enough excitation to switch its magnetisation. Furthermore, for a Rayleigh wave, since it generates perpendicular effective fields, overshoot of coherent switching can be avoided. Bit-selectivity in an MRAM-like scheme is obtained by using a not-switching SAW, and by locally applying a small field. This can be achieved by sending a current through the structure of interest. Reading-out multiple elements in the same time slot requires some processing logics.

Figure 17:
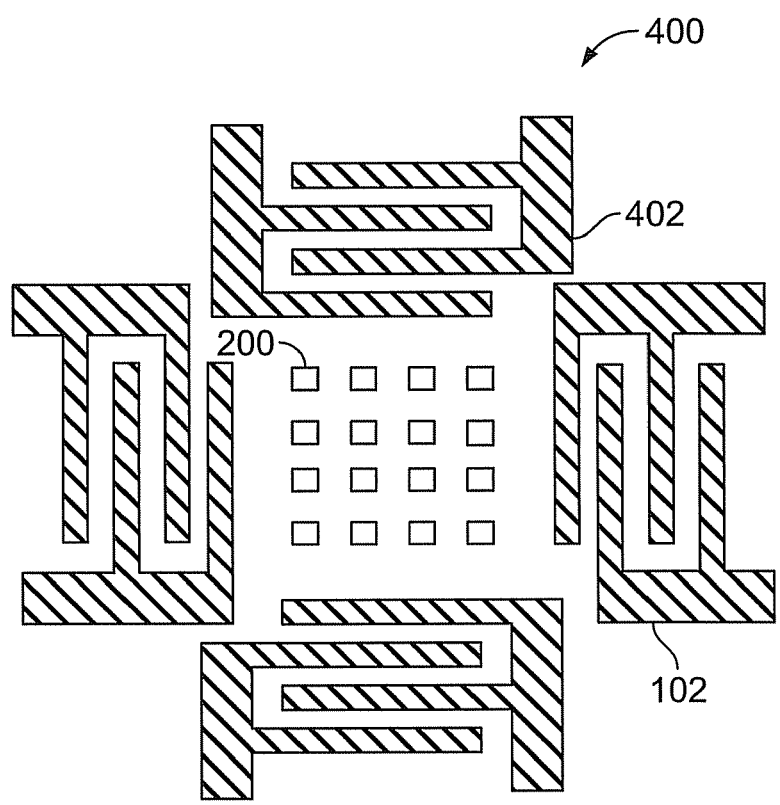
FIG. 17 gives a schematic representation of a device wherein both Rayleigh SAWs and shear SAWs can be applied, according to the present invention.

In a further embodiment 400, use is made of both Rayleigh SAWs and shear SAWs on the same surface. This is made possible by a design in which the SAW generating means 102, 402, which may for example be IDTs, for the Rayleigh SAWs and the shear SAWs are at an angle of substantially 90°. This is shown in FIG. 17. In such a design a Rayleigh wave is running at 90° with respect to the shear wave. The shear wave generates a smaller perturbation, which makes it suitable for read-out activation. Writing then can be done by the Rayleigh wave. Bit-selectivity is obtained by sending a current through the element in order to generate a magnetic field. The current can be replaced by any other means that changes the effective field of one magnetic element and thus lowers the switching threshold value, i.e. ways such as magnetic fields generated by current conductors close by, or thermally or spin torque (angular momentum) induced magnetic changes generated by heaters, laser pulses, or currents through the element. This design allows a simultaneous read and write operation. Different write operations can be done together. Reading-out multiple elements in the same time slot requires some processing logic. As the velocity of the shear wave is higher than for Rayleigh waves for the same design of the IDTs, it is possible to have a shear wave running at an angle of 90° with the Rayleigh wave and at a slightly higher frequency (other position on absorption peak). Thus the shear frequency is the read-out frequency, having a smaller magnetic perturbation, and the Rayleigh frequency can be the writing frequency.

Figure 18A:
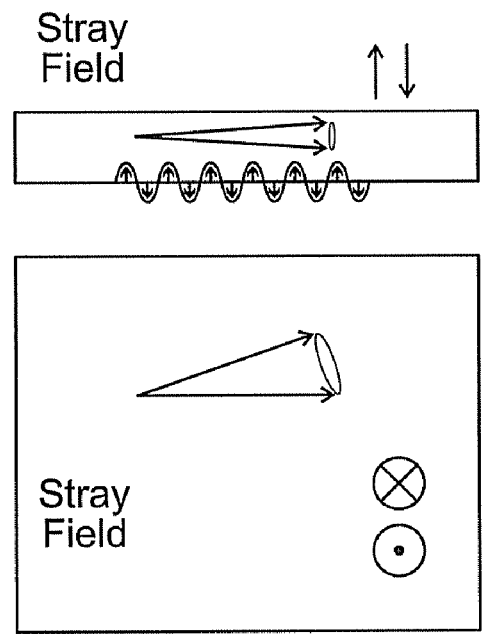
FIG. 18a gives a schematic representation of the magnetisation fields occurring in a magnetic element upon SAW activation, according to the present invention.

In another embodiment, a RF mechanical resonator 500 is provided. The RF mechanical resonator 500 is based on the devices for switching and assessing a magnetisation state of a ferromagnetic component, as described in the above embodiments. The effect of a SAW on a magnetic layer 502 is stated to cause a perturbation of the magnetisation. For a Rayleigh as well as a shear wave this magnetisation change also has an out-of-plane component. Since precession tends to happen in the plane perpendicular to the effective field, a large out-of-plane component is generated, which will be almost completely countered by the large demagnetisation fields generated by the thin film magnetic layer 502. This interaction of fields and forces make a net stray field to arise from the magnetic layer 502, as shown in FIG. 18a. Here a Rayleigh wave causes a magnetisation rotation as depicted in the FIG. 18a, causing an alternating stray field. For a shear wave, the same reasoning can be used.

Figure 18B:
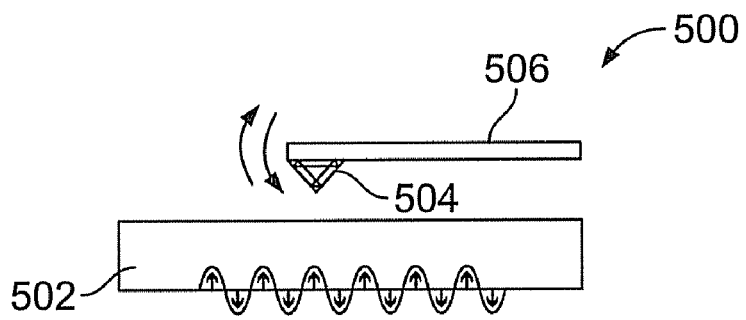
FIG. 18b gives a schematic representation of a radio frequent mechanical resonator, using an induced stray field according to the present invention.

The stray field can then be used for activation of a resonator. In FIG. 18b, a tip, e.g. an AFM-like tip 504, is brought close to the magnetic layer 502. To have the stray fields interact with the tip 504, the latter was chosen to be magnetic. This is a GHz-compatible tip 504, which typically is coated with a magnetic material, Hence, the tip 504 feels the magnetic field, and through the periodicity of this field, the tip 504, which is mounted on a cantilever-type structure 506 gets attracted and repelled by the SAW-activated magnetic layer. If the tip 504 chosen is designed to have its resonance in the right frequency range, i.e. near the FMR frequency of the magnetic layer 502, the tip 504 can be brought into resonance. This mechanical resonance generated by the tip 504 can then be the output of the system. In other words, the magnetic force exerted by the magnetic field will be sensed by the tip 504 and converted to a mechanical resonance.

Figure 19:
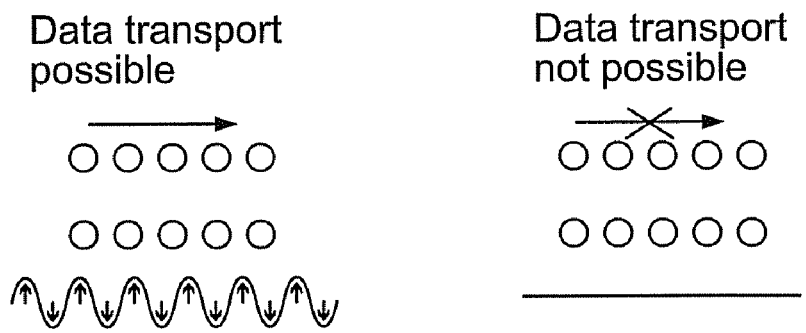
FIG. 19 gives a schematic representation of the application of SAW induced magnetisation as driving force for use in magnetic logic.

In a further embodiment of the invention, the use of a SAW as driving force in magnetic logic is described. The use of magnetic logic is known e.g. from Cowburn et al. in Science 287, (2000) p 1466. Magnetic logic elements are the magnetic equivalent of electronic components. In magnetic logic elements, the state of the element is not defined by the charge but by the magnetisation of the element. This requires the constant presence of driving magnetic fields. Due to several considerations, among which power consumption plays a crucial role, the use of external fields is not a preferred situation. In the embodiment according to the present invention, the magnetic field required for switching is created by an effective magnetic field induced by SAWs, i.e. using the devices described in the previous embodiments. In FIG. 19 a small part of a possible magnetic logic circuit is shown. Propagation of magnetic information in these magnetic networks can thus be assisted by usage of SAW-generated magnetic switching instead of an externally applied field. This also gives the opportunity to add extra inputs through local magnetic fields and by the use of saw absorbing magnetic layers that can be field-tuned for passing/not-passing the saw through to the magnetic logic array. Magnetic logic circuits work by transport of magnetic information. These logic arrays have an input bit, which decides whether the information can move up and down the line. The driving force for the movement is the magnetic field. In this way, by using the SAW as the driving force, a logic system without external fields is created. In this example, this is a logic AND gate between the input bit and the "clock" (SAW). The output will only have an alternating output bit when the SAW is on as shown in FIG. 19a and the input bit is set to allow rippling of the excitons through the line shown in FIG. 19a. In all other settings for the inputs, no rippling is possible, hence meeting the properties of an AND-gate. NOT-gates also are known, e.g. from Cowburn et al. in Science 287, (2000) p 1466. For these gates an alternating field is required. The SAW is also suited for this application. Generally speaking, the SAW-FMR principle can be applied in all magnetic logic to replace external fields. The application of SAWs also implies the operation frequencies to be in the GHz region. This is the frequency range in which currently the electronic logic operate, making magnetic logic a valuable alternative.

Figure 20:
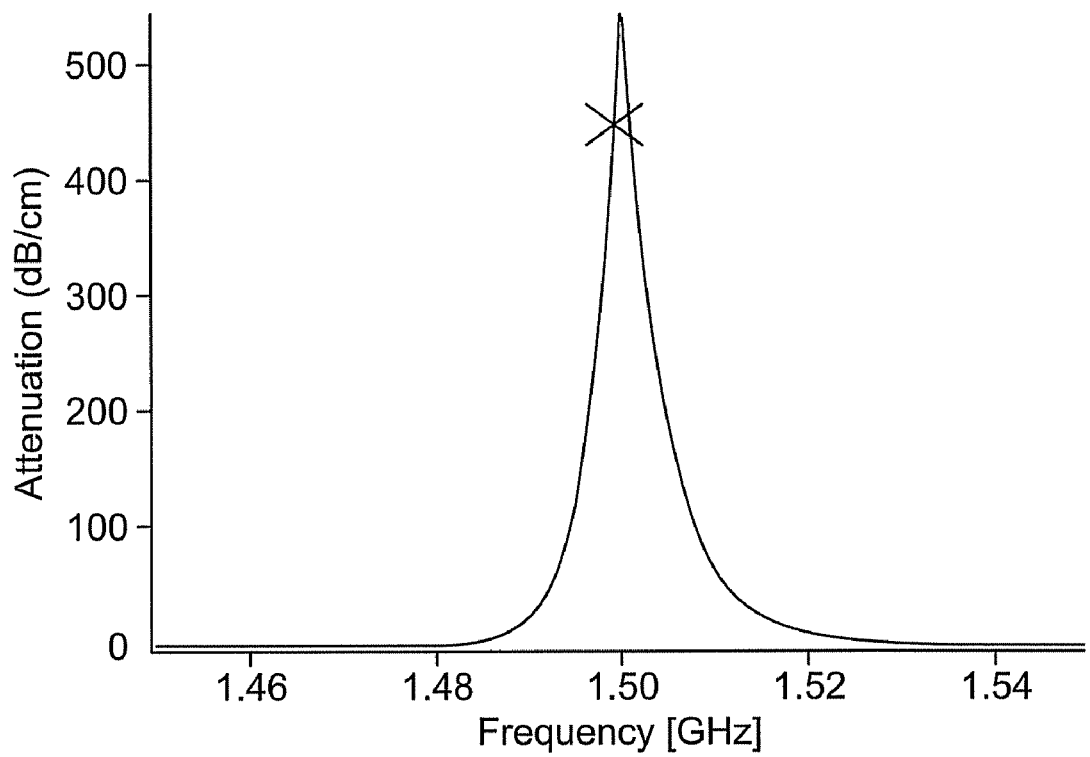
FIG. 20 is a graph of the frequency range that can be used for the SAW.

In a further embodiment according to the present invention, a method for active compensation of switching behaviour changes is provided. The SAW-FMR devices have to be operated at a certain frequency to be at its ideal operating setting. This frequency needs to be equal to or close to the FMR frequency, as dictated by the magnetic element. Tuning the device used can be performed by the choice of material, the shape of the element, the thickness of the element, all these parameters are design parameters and should be chosen in order to determine the operation frequency. In other words, in order to allow operation, the SAW device should have a reasonable bandwidth around the FMR frequency of the magnetic element. In order to allow compensating of changes in switching behaviour and to allow operating in a stable regime, the SAW is to be locked just below FMR frequency. At this frequency the SAW has a semi-linear frequency-attenuation response, as shown in FIG. 20. The lock-in frequency is indicated with a cross. By locking it at not-maximum attenuation, a means is created to detect changes in conditions of the system by monitoring the SAW attenuation. If, for example, the attenuation becomes higher, then there is a shift of conditions so that the systems FMR frequency gets lower, hence the frequency has to be lowered. If the attenuation diminishes, then the FMR frequency is increasing, and the SAW frequency has to be increased. The use of this way of compensation is only based on the SAW attenuation and provides an easy way of correcting for drift of the characteristics. For example, thermal effects, as well as magnetic fields from the environment can be accounted for. This method may be applied to the different methods described in different embodiments of the present invention. The corresponding devices may be adapted to operate according to the present embodiment.

Figure 21:
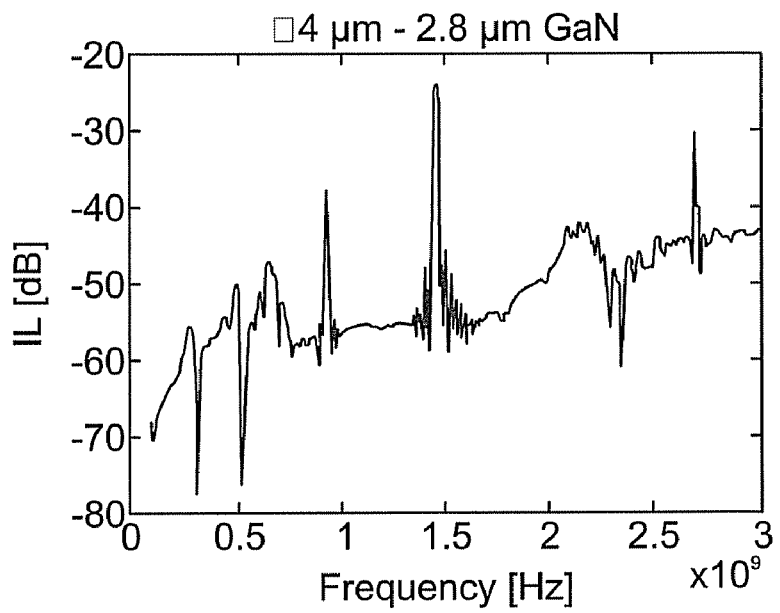
FIGS. 21 to 24 show experimental results of embodiments of the present invention.

In a further embodiment of the invention, some experimental results on a Rayleigh SAWs will be discussed. In this embodiment, the SAW generating means is an IDT positioned onto a GaN layer. The devices work at 2.7 GHz. FIG. 21 shows a transfer characteristic of the device according to this embodiment. The IDTs have a wavelength of 4 micron. The peaks in the insertion loss are the operating frequencies of the SAW devices. Two main peaks are observed, i.e. at 1.46 GHz, which is the frequency corresponding to the first harmonic, and one at 2.8 GHz, which is the second harmonic.

Figure 22A:
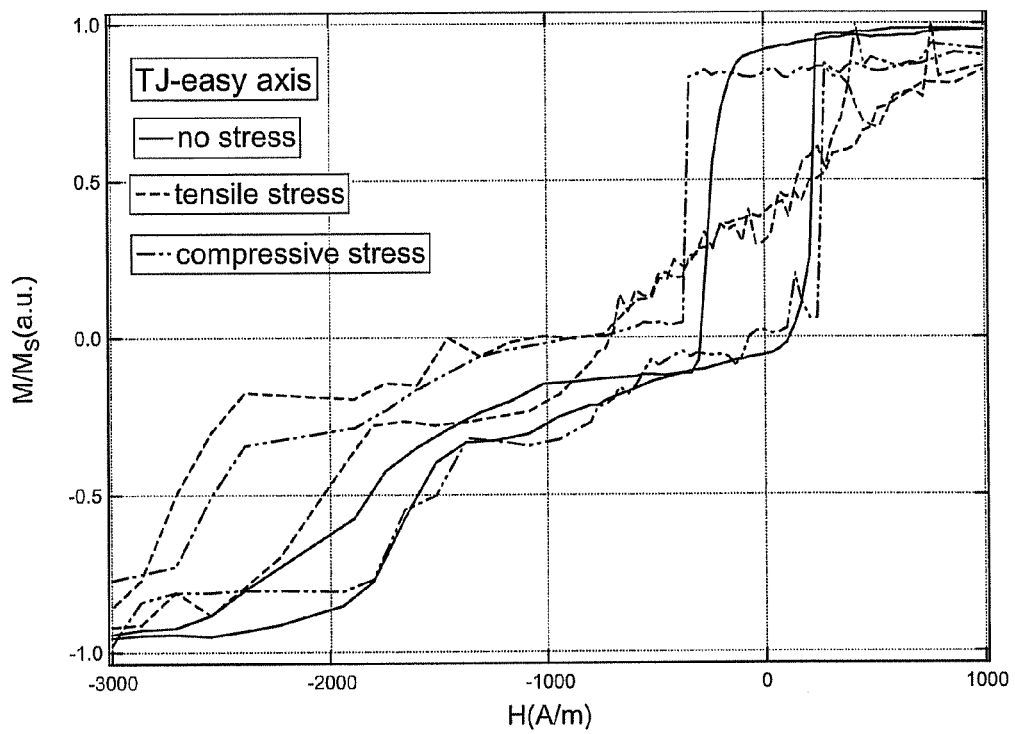
Figure 22B:
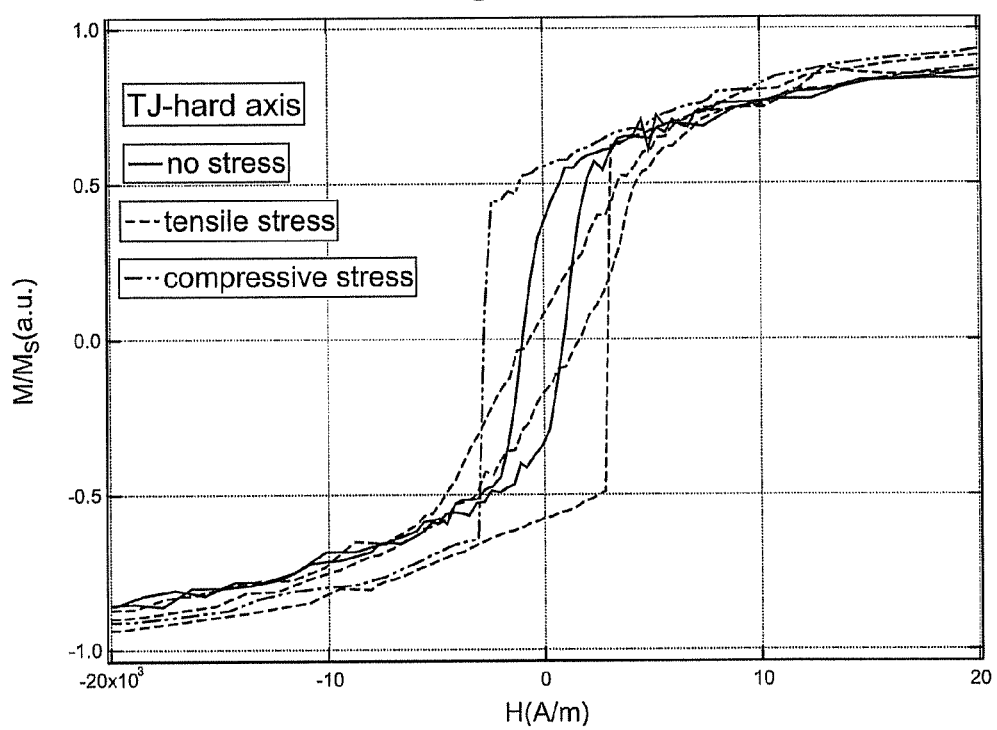
Figure 23:
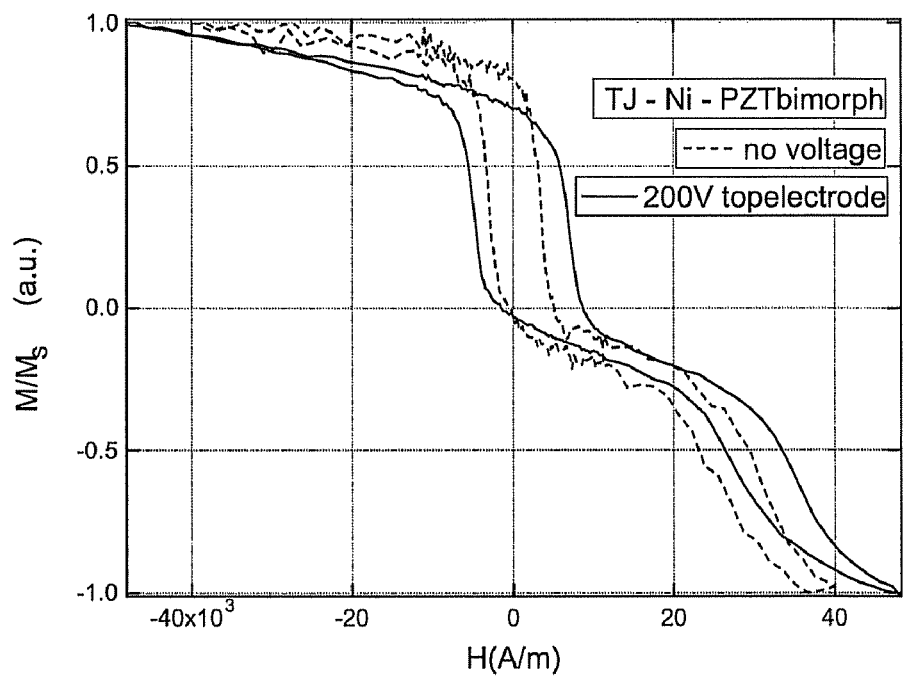

Furthermore, strain dependence of magnetic materials and of components comprising magnetic materials is investigated. This strain is generated by 3-point bending (FIG. 22) as well as by piezoelectric layers (FIG. 23). Rotation of magnetisation was achieved, showing the possibility to interchanged magnetic fields and stresses. The results shown in FIGS. 22 and 23 are results obtained at low frequencies. All results have been demonstrated on single layers as well as magnetic components. FIG. 22a shows the measurement in the easy axis direction of a tunnel junction with the following layer sequence: $Ta/Ni_{80}Fe_{20}/IrMn/Co_{90}Fe_{10}/AlO_x/Co_{90}Fe_{10}/Ni/Si$. The hysteresis loops originating from the free layer (around zero field) and the fixed layer are separated. The stress dependence of the fixed layer is practically zero, while the free layer has a stress response similar to a single Ni layer. Tensile stress makes the magnetisation rotate away from the stress direction, while compressive stress tends to pull it towards the stress direction. FIG. 22b shows the hard axis of the free layer as the middle part of the figure (between −4 kA/m and 4 kA/m), and of the fixed layer as the parts outside this region. Again the fixed layer maintains its magnetic characteristics under stress, while the free layer responds as described above. It has to be noticed that the a non stress hard and soft free layer, due to the coupling with the fixed layer, is presence. FIG. 23 shows the results measured at a Ni-based tunnel junction deposited on a bimorphous substrate. The Ni dictates the magnetisation of the free layer, hence giving it its voltage sensitivity.

Figure 24:
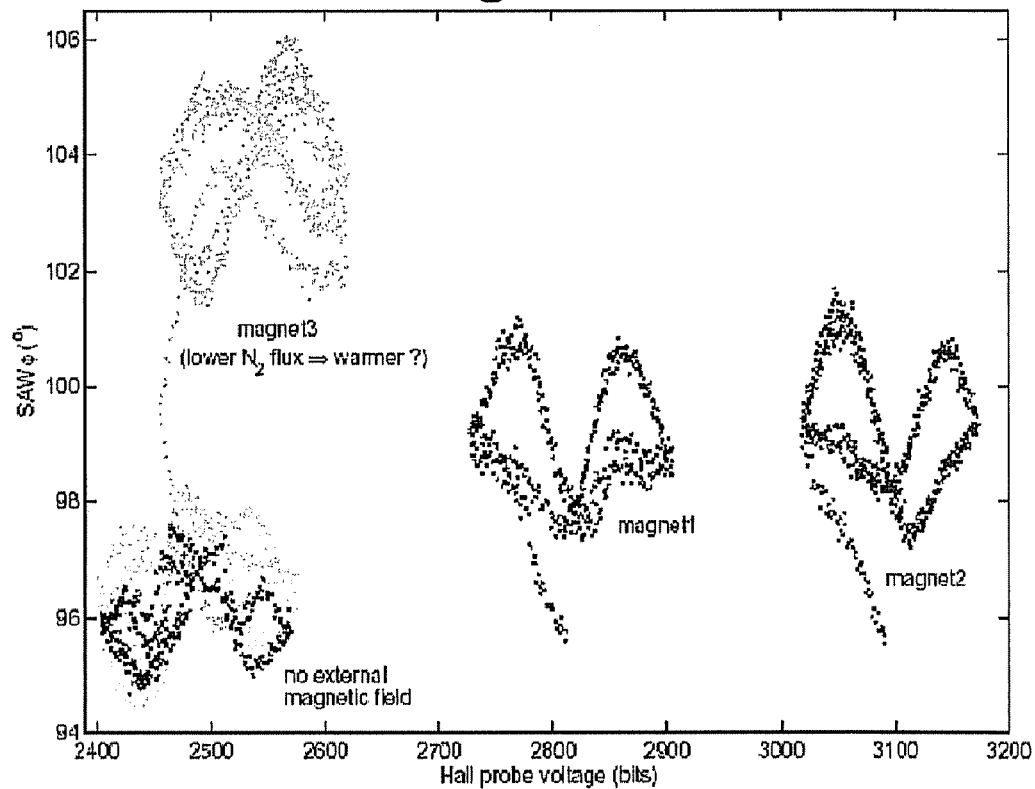

Furthermore, experiments were carried out at lower frequencies, which showed absorption of a shear SAW in a magnetic layer, manifested by a phase dependence of the SAW on an applied magnetic field (FIG. 24). As shown in FIG. 24 phase of a shear wave depends on the applied magnetic field. The amount of change is up to 4 degrees. The different curves are for different biasing fields. The magnetic field is measured by a Hall probe. All measured loops are between −100 and 100 Gauss. Notice the presence of the hysteresis of the magnetic material in the SAW behavior. This means the strains interact. All results were demonstrated on single layers, as well as magnetic components.

Figure 25:
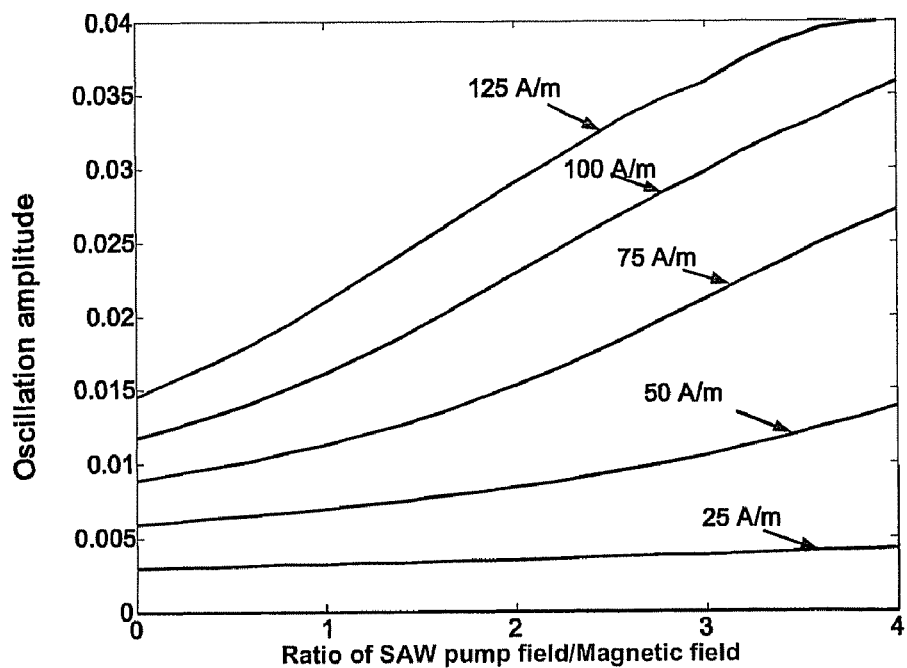
FIGS. 25 and 26 illustrate that in embodiments according to the present invention the damping towards the equilibrium state, represented by the Gilbert damping parameter $\alpha$, can be actively controlled by the amplitude and the phase of the SAW.

Simulations have been performed to study the effect on a magnetic element of the combination of an additional magnetic field at resonance frequency and a SAW field at double the resonance frequency, according to the present invention. These simulations show that the SAW can change, e.g. amplify, the amplitude and the damping of the oscillations that are driven by a magnetic field. Theoretically, alternatively, the saw field can have a frequency substantially equal to an even multiple of the ferromagnetic resonance frequency. Illustrations are given in FIG. 25 where it is shown that by application of the SAW field the oscillation amplitude of the magnetic material, seen as an absorption peak, is enhanced. The oscillation amplitude is plotted for different values of the magnetic field amplitude (legend) and in function of the ratio of the SAW amplitude versus magnetic field amplitude with a fixed phase relationship between the SAW and the magnetic field. At zero SAW amplitude, the excited resonance is equal to the classical ferromagnetic resonance peak. At higher SAW values, the oscillation amplitude is increased due to the application of the SAW field. The increase can be changed by tuning the value of the phase relationship between the SAW and the magnetic field.

Figure 26:
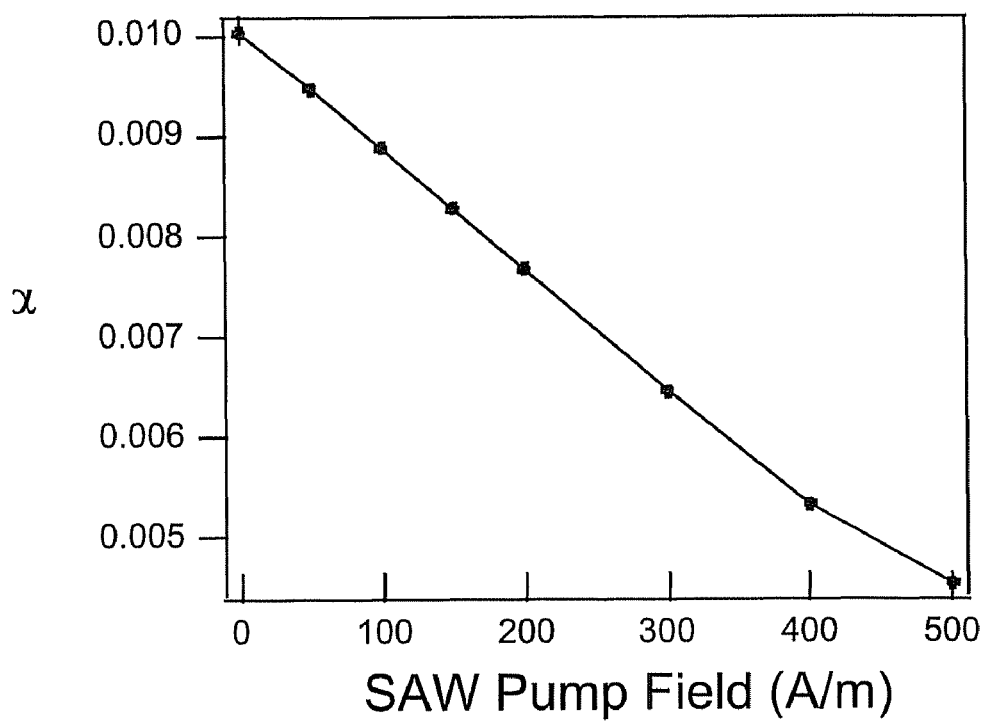

Another illustration is given in FIG. 26, where the damping of magnetic motion towards the equilibrium state, represented by the Gilbert damping parameter α, is actively controlled by the amplitude of the SAW.

The SAW can thus change the resonant properties of the ferromagnetic material and therefore the SAW can also alter the switching behaviour of the magnetic element. In this way the SAW helps in controlling the damping process in the ferromagnetic material. Control over the damping parameter is important e.g. to optimise the switching speed of the magnetic element. For too low damping values, the magnetic element can switch very fast but never stops ringing, i.e. precessing, whereas for too high values of the damping, the magnetic element will switch too slow.

It is to be understood that although preferred embodiments, specific constructions and configurations, as well as materials, have been discussed herein for devices, systems and methods according to the present invention, various changes or modifications in form and detail may be made without departing from the scope and spirit of this invention.

The invention claimed is:

1. A method comprising:
    providing a device that includes:
        at least one ferromagnetic element having a ferromagnetic resonance frequency $\nu_{FMR}$ and being capable of magneto-elastic energy conversion; and
        a layer comprising piezoelectric material, the layer being adapted for transporting a surface acoustic wave having a frequency $\nu_{SAW}$;
        wherein the layer comprising piezoelectric material is in contact with the at least one ferromagnetic element and the surface acoustic wave frequency $\nu_{SAW}$ is substantially equal to the ferromagnetic resonance frequency $\nu_{FMR}$ or an integer multiple of the ferromagnetic resonance frequency $\nu_{FMR}$;
    generating a surface acoustic wave in the layer comprising piezoelectric material, such that the surface acoustic wave interacts with the ferromagnetic element to influence a magnetization of the ferromagnetic element;
    dynamically measuring a variation of a characteristic parameter influenced by the ferromagnetic element;
    deriving, from the variation of the characteristic parameter, a corresponding value of a measured quantity.

2. A method according to claim 1, further comprising:
    allowing the ferromagnetic element to interact with an environment for which an environmental quantity is to be measured;
    wherein the deriving of the measured quantity includes deriving the environmental quantity from the variation of the characteristic parameter.

3. A method according to claim 2, wherein the physical quantity of the ferromagnetic element is a magneto resistance of the ferromagnetic element.

4. A method according to claim 2, wherein the deriving from the variation of the characteristic parameter a corresponding value of the physical quantity comprises:
    deriving from the dynamic measurement a degree of anisotropy of the at least one ferromagnetic element; and
    deriving from the degree of anisotropy a corresponding value of the physical quantity.

5. A method according to claim 2, wherein the variation in the characteristic parameter influenced by the at least one ferromagnetic element is induced by the magnetization or magnetization direction of the ferromagnetic element.

6. A method according to claim 2, further comprising applying an additional magnetic field at the ferromagnetic resonance frequency or an integer multiple of the ferromagnetic resonance frequency $\nu_{FMR}$.

7. A method according to claim 6, wherein the surface acoustic wave has a frequency $\nu_{SAW}$ substantially equal to the ferromagnetic resonance frequency $\nu_{FMR}$ or an integer multiple of the ferromagnetic resonance frequency $\nu_{FMR}$.

8. A method according to claim 6, wherein the integer multiple is an even integer multiple.

9. A method according to claim 1, wherein the device includes a plurality of said ferromagnetic elements in contact with the piezoelectric layer, further comprising:
    allowing the plurality of ferromagnetic elements to interact with an environment for which a magnetic image is to be created;
    and wherein:
        the generating a surface acoustic wave includes generating a surface acoustic wave that interacts with the plurality of ferromagnetic elements so as to influence a magnetization state of the ferromagnetic elements;
        the dynamic measuring includes dynamically measuring, for each of the plurality of ordered ferromagnetic elements, a variation of characteristic parameters influenced by the ferromagnetic elements; and
        the deriving includes deriving, from the variation of the characteristic parameters, a corresponding value of a physical quantity for each of the plurality of ordered ferromagnetic elements.

10. A method according to claim 9, wherein the physical quantity for each of the ferromagnetic elements is a magneto resistance of the ferromagnetic elements.

11. A method according to claim 9, wherein the allowing the plurality of ordered ferromagnetic elements to interact with an environment and the generating a surface acoustic wave is performed one time for all ferromagnetic elements in parallel and wherein the dynamically measuring the variation and the deriving a corresponding value is performed on a per ferromagnetic element basis.

12. A method according to claim 9, further comprising applying an additional magnetic field at the ferromagnetic resonance frequency or an integer multiple of the ferromagnetic resonance frequency $\nu_{FMR}$.

13. A method according to claim 12, wherein the surface acoustic wave has a frequency $\nu_{SAW}$ substantially equal to the ferromagnetic resonance frequency $v_{FMR}$ or an integer multiple of the ferromagnetic resonance frequency $v_{FMR}$.

14. A method according to claim 12, wherein the integer multiple is an even integer multiple.

15. A method according to claim 1, wherein the measured quantity is a readout-value of the ferromagnetic element, and wherein:
the generating of the surface acoustic wave is such that a precessional movement of a magnetization in the ferromagnetic element is achieved and such that a corresponding magnetization state of the at least one ferromagnetic element is not switched.

16. A method according to claim 15, wherein the characteristic parameter influenced by the ferromagnetic element is a magneto resistance of the ferromagnetic element.

17. A method according to claim 15, wherein the deriving from the variation of the characteristic parameter the read-out value comprises:
deriving a phase difference between an input signal applied to a surface acoustic wave generating means and an output signal obtained from the dynamic measurement of the characteristic parameter; and
deriving from the phase difference the read-out value.

18. A method according to claim 15, wherein the read-out value corresponds with a distinct number of specific values.

19. A method according to claim 15, further comprising applying an additional magnetic field at the ferromagnetic resonance frequency or an integer multiple of the ferromagnetic resonance frequency $v_{FMR}$.

20. A method according to claim 19, wherein the surface acoustic wave has a frequency $v_{SAW}$ substantially equal to the ferromagnetic resonance frequency $v_{FMR}$ or an integer multiple of the ferromagnetic resonance frequency $v_{FMR}$.

21. A method according to claim 19, wherein the integer multiple is an even integer multiple.

22. A method according to claim 15, further comprising switching the ferromagnetic element by a method that includes:
generating a surface acoustic wave that operates to achieve a precessional movement of a magnetization in the ferromagnetic element; and
orienting a corresponding magnetization state of the ferromagnetic element.

23. A method for switching at least one ferromagnetic element, comprising:
generating a surface acoustic wave in a layer comprising piezoelectric material, the layer being in contact with the at least one ferromagnetic element, the generating a surface acoustic wave being for achieving a precessional movement of a magnetization in the ferromagnetic element; and
orienting a corresponding magnetization state of the ferromagnetic element.

24. A method according to claim 23, wherein the orienting the magnetization state of the ferromagnetic element is performed by generating a ferromagnetic element specific additional field.

25. A method according to claim 23, wherein the surface acoustic wave is one of a Rayleigh wave with an angle between an easy axis of the ferromagnetic element and a direction of effective field of 90° during a first half period of the Rayleigh wave and a shear wave with the angle between the direction of an easy axis of the ferromagnetic element and the direction of the effective magnetic field generated greater than 45°.

26. A method according to claim 23, further comprising applying an additional magnetic field at the ferromagnetic resonance frequency or an integer multiple of the ferromagnetic resonance frequency $v_{FMR}$.

27. A method according to claim 26, wherein the surface acoustic wave has a frequency $v_{SAW}$ substantially equal to the ferromagnetic resonance frequency $v_{FMR}$ or an integer multiple of the ferromagnetic resonance frequency $v_{FMR}$.

28. A method according to claim 26, wherein the integer multiple is an even integer multiple.

29. A method according to claim 1, further comprising:
monitoring absorption of a surface acoustic wave by the ferromagnetic element;
deriving from the absorption a difference between a working frequency of the surface acoustic wave and a ferromagnetic resonance frequency of the ferromagnetic element; and
tuning the working frequency of the surface acoustic wave towards the ferromagnetic resonance frequency.

30. A method according to claim 29, wherein the tuning of the working frequency of the surface acoustic wave generating means towards the ferromagnetic resonance frequency is tuning the working frequency to a frequency slightly different from the ferromagnetic resonance frequency.

31. A method according to claim 30, wherein the frequency corresponds with the absorption of the surface acoustic wave by the ferromagnetic element within 1% and 99% of the absorption of the surface acoustic wave by the ferromagnetic element at the ferromagnetic resonance frequency.

\* \* \* \* \*